(12) United States Patent
Yokino et al.

(10) Patent No.: US 11,493,386 B2
(45) Date of Patent: Nov. 8, 2022

(54) SPECTRAL MODULE AND METHOD FOR MANUFACTURING SPECTRAL MODULE

(71) Applicant: HAMAMATSU PHOTONICS K.K., Hamamatsu (JP)

(72) Inventors: Takafumi Yokino, Hamamatsu (JP); Katsuhiko Kato, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 31 days.

(21) Appl. No.: 17/256,918

(22) PCT Filed: Jun. 17, 2019

(86) PCT No.: PCT/JP2019/023957
§ 371 (c)(1),
(2) Date: Dec. 29, 2020

(87) PCT Pub. No.: WO2020/008851
PCT Pub. Date: Jan. 9, 2020

(65) Prior Publication Data
US 2021/0278277 A1 Sep. 9, 2021

(30) Foreign Application Priority Data

Jul. 6, 2018 (JP) .............................. JP2018-129239

(51) Int. Cl.
H05K 3/40 (2006.01)
G01J 3/28 (2006.01)
(Continued)

(52) U.S. Cl.
CPC ............... *G01J 3/2803* (2013.01); *G01J 3/18* (2013.01); *H05K 1/118* (2013.01); *H05K 3/4007* (2013.01); *H05K 3/00* (2013.01)

(58) Field of Classification Search
CPC .......... G01J 3/2803; G01J 3/18; H05K 1/118; H05K 3/4007; H05K 3/00; Y10T 29/4913; Y10T 29/49142; Y10T 29/49155
(Continued)

(56) References Cited

U.S. PATENT DOCUMENTS 9,565,346 B2 * 2/2017 Ikemoto ................. G03B 17/02
10,132,683 B2 * 11/2018 Yokino ..................... G01J 3/36
(Continued)

FOREIGN PATENT DOCUMENTS

DM 090238 3/2016
DM 090239 3/2016
(Continued)

OTHER PUBLICATIONS

International Preliminary Report on Patentability dated Jan. 21, 2021 for PCT/JP2019/023957.

*Primary Examiner* — Donghai D Nguyen
(74) *Attorney, Agent, or Firm* — Faegre Drinker Biddle & Reath LLP

(57) ABSTRACT

A spectroscopic module includes a support body having a bottom wall portion and a side wall portion surrounding a space on one side of the bottom wall portion, a spectroscopic portion provided on the one side of the bottom wall portion and having a plurality of grating grooves, a photodetector attached to the side wall portion so as to face the spectroscopic portion via the space and having a plurality of photodetection channels, a plurality of first terminals provided on a surface of the support body on a side opposite to the space so as to be disposed along the surface of the support body and electrically connected to the photodetector, and a wiring unit having a plurality of second terminals respectively facing the plurality of first terminals and respectively joined to the plurality of first terminals and a plurality
(Continued)

of third terminals respectively and electrically connected to the plurality of second terminals.

11 Claims, 15 Drawing Sheets

(51) Int. Cl.
  *G01J 3/18* (2006.01)
  *H05K 1/11* (2006.01)
  *H05K 3/00* (2006.01)
(58) Field of Classification Search
  USPC .......................................... 29/832, 840, 846
  See application file for complete search history.

(56) References Cited

U.S. PATENT DOCUMENTS

2005/0185088 A1* 8/2005 Kale ................. H01L 27/14625
  257/E31.127
2009/0262346 A1 10/2009 Egloff et al.

FOREIGN PATENT DOCUMENTS

| | | |
|---|---|---|
| DM | 090240 | 3/2016 |
| DM | 090241 | 3/2016 |
| JP | 2001-267540 A | 9/2001 |
| JP | 2004-247677 A | 9/2004 |
| JP | 2009-210416 A | 9/2009 |
| JP | 2012-084392 A | 4/2012 |
| JP | 2014-098653 A | 5/2014 |
| JP | 1558757 S | 9/2016 |
| JP | 1558758 S | 9/2016 |
| JP | 1568880 S | 2/2017 |
| JP | 1578447 S | 6/2017 |
| JP | 1554540 S | 7/2017 |
| JP | 1554541 S | 7/2017 |
| JP | 1554542 S | 7/2017 |
| JP | 1554894 S | 7/2017 |
| JP | 1586330 S | 9/2017 |
| JP | 1586331 S | 9/2017 |
| JP | 1561325 S | 10/2017 |
| JP | 1566300 S | 12/2017 |
| JP | 1566301 S | 12/2017 |
| WO | WO-00/40935 A1 | 7/2000 |
| WO | WO-2008/149928 A1 | 12/2008 |
| WO | WO-2014/156710 A1 | 10/2014 |
| WO | WO-2017/022839 A1 | 2/2017 |

* cited by examiner

Fig.12
(a)
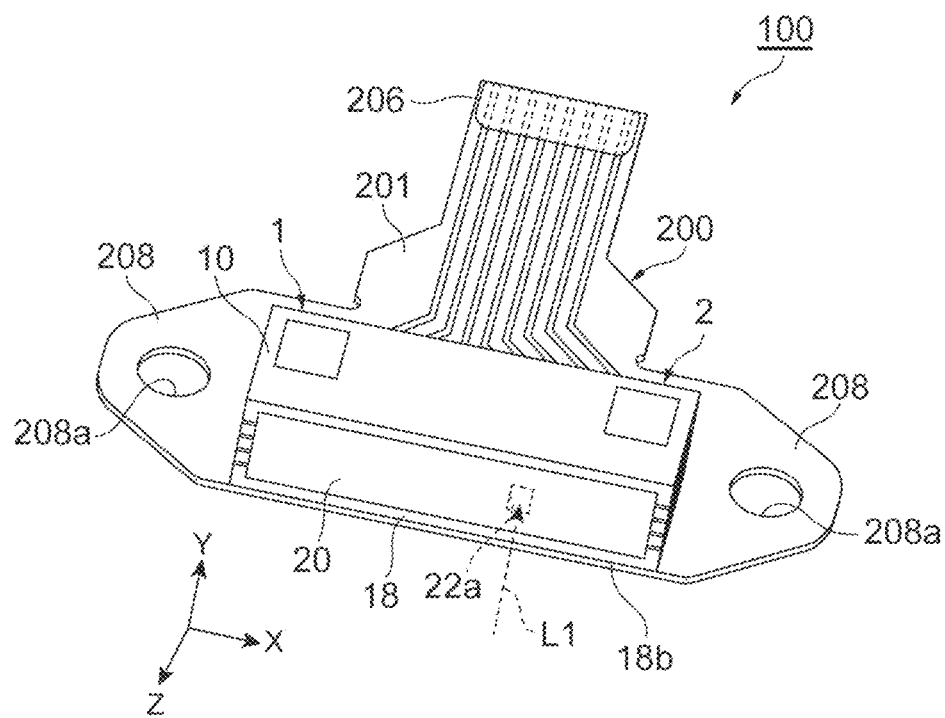
(b)
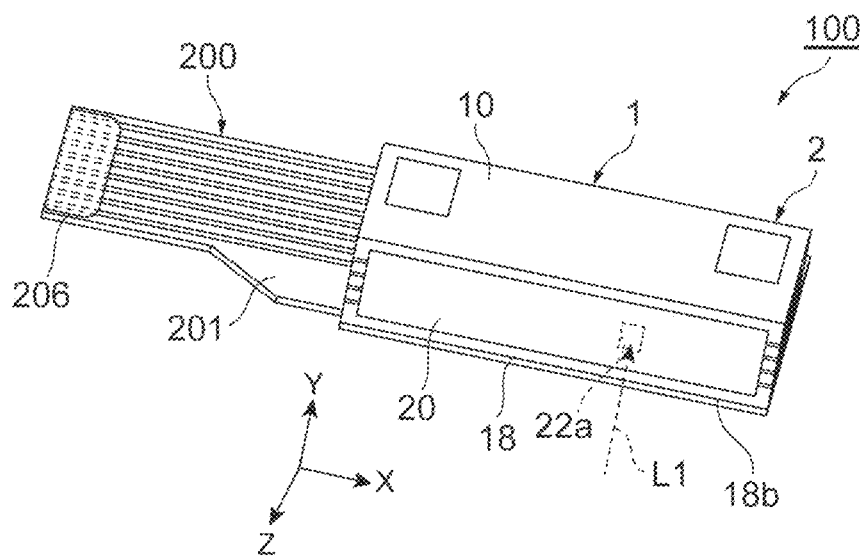

SPECTRAL MODULE AND METHOD FOR MANUFACTURING SPECTRAL MODULE

TECHNICAL FIELD

The present disclosure relates to a spectroscopic module and a method for manufacturing a spectroscopic module.

BACKGROUND ART

Known is a spectroscopic module including a spectroscopic module having a light transmitting member and a spectroscopic portion and a photodetector provided on the light transmitting member so as to face each other via the light transmitting member, a package accommodating the spectroscopic module, and a lead provided in the package and electrically connected to the photodetector (see, for example, Patent Literature 1).

CITATION LIST

Patent Literature

Patent Literature 1: Japanese Unexamined Patent Publication No. 2009-210416

SUMMARY OF INVENTION

Technical Problem

The spectroscopic module as described above may be mounted and used on a rigid wiring substrate. In that case, the package may be distorted due to the stress or the like that is generated during the mounting or the package may be distorted due to the thermal strain or the like that is generated on the rigid wiring substrate after the mounting. However, in the spectroscopic module as described above, the spectroscopic portion and the photodetector are provided on the light transmitting member so as to face each other via the light transmitting member, and thus the relationship between the position (coordinates) of each of a plurality of photodetection channels of the photodetector and the peak wavelength of light incident on each of the plurality of photodetection channels (hereinafter, sometimes simply referred to as "relationship between the photodetection channel and the peak wavelength") is unlikely to deviate even if the package is distorted.

In contrast, in a spectroscopic module configured such that the spectroscopic portion and the photodetector face each other via a space, particularly in a spectroscopic module configured such that a support body defining a space supports the spectroscopic portion and the photodetector, the positional relationship between the spectroscopic portion and the photodetector is likely to deviate and thus the relationship between the photodetection channel and the peak wavelength is also likely to deviate when the support body is distorted during or after mounting with respect to a rigid wiring substrate.

In this regard, an object of the present disclosure is to provide a spectroscopic module and a method for manufacturing the spectroscopic module with which a decline in detection accuracy can be reliably suppressed in a configuration in which a spectroscopic portion and a photodetector face each other via a space.

Solution to Problem

A spectroscopic module of one aspect of the present disclosure includes a support body having a bottom wall portion and a side wall portion surrounding a space on one side of the bottom wall portion, a spectroscopic portion provided on the one side of the bottom wall portion and having a plurality of grating grooves, a photodetector attached to the side wall portion so as to face the spectroscopic portion via the space and having a plurality of photodetection channels, a plurality of first terminals provided on a surface of the support body on a side opposite to the space so as to be disposed along the surface of the support body and electrically connected to the photodetector, and a wiring unit having a plurality of second terminals respectively facing the plurality of first terminals and respectively joined to the plurality of first terminals and a plurality of third terminals respectively and electrically connected to the plurality of second terminals.

In the spectroscopic module of one aspect of the present disclosure, the plurality of first terminals electrically connected to the photodetector are provided on the surface of the support body and the plurality of second terminals of the wiring unit respectively face the plurality of first terminals and are respectively joined to the plurality of first terminals. In a configuration in which a plurality of terminals of a rigid wiring substrate are respectively joined to the plurality of first terminals, for example, the support body is distorted due to the stress or the like that is generated during the joining or the support body is distorted due to the thermal strain or the like that is generated on the rigid wiring substrate after the joining, and thus the positional relationship between the spectroscopic portion and the photodetector may deviate and the relationship between the photodetection channel and the peak wavelength may deviate. In contrast, in the spectroscopic module of one aspect of the present disclosure, the electrical connection between the photodetector and the rigid wiring substrate can be realized via the wiring unit, and thus it is possible to suppress the deviation in the relationship between the photodetection channel and the peak wavelength. Accordingly, with the spectroscopic module of one aspect of the present disclosure, it is possible to reliably suppress a decline in detection accuracy in the configuration in which the spectroscopic portion and the photodetector face each other via the space.

In the spectroscopic module of one aspect of the present disclosure, the plurality of first terminals may be provided on a flat region having a largest area among a plurality of flat regions, the plurality of flat regions constituting the surface of the support body. As a result, it is possible to improve the degree of freedom in terms of the shape of each first terminal, the disposition of the plurality of first terminals, and so on and it is possible to realize a reliable joining between the first terminal and the second terminal facing each other.

In the spectroscopic module of one aspect of the present disclosure, the plurality of first terminals may be provided on a surface of the side wall portion on the side opposite to the space as the surface of the support body. By the surface of the side wall portion on the side opposite to the space being wide, it is possible to improve the degree of freedom in terms of the shape of each first terminal, the disposition of the plurality of first terminals, and so on and it is possible to realize a reliable joining between the first terminal and the second terminal facing each other.

In the spectroscopic module of one aspect of the present disclosure, the spectroscopic portion and the photodetector face each other in a first direction, the plurality of grating grooves are arranged in a second direction perpendicular to the first direction, and the plurality of first terminals may be provided on a region of the surface of the side wall portion, the region extending in the second direction as a longitudinal direction. By the region that extends in the second direction as a longitudinal direction being wide, it is possible to improve the degree of freedom in terms of the shape of each first terminal, the disposition of the plurality of first terminals, and so on and it is possible to realize a reliable joining between the first terminal and the second terminal facing each other.

In the spectroscopic module of one aspect of the present disclosure, a first terminal and a second terminal facing each other in the plurality of first terminals and the plurality of second terminals may be joined to each other via a joining member. As a result, it is possible to realize a reliable joining between the first terminal and the second terminal facing each other.

In the spectroscopic module of one aspect of the present disclosure, the joining member may be a solder layer. As a result, it is possible to easily realize a reliable joining between the first terminal and the second terminal facing each other.

In the spectroscopic module of one aspect of the present disclosure, the joining member may hold a gap formed between the support body and the wiring unit. As a result, even if the wiring unit is deformed, the impact of the deformation is mitigated in the gap between the support body and the wiring unit, and thus it is possible to suppress a deviation in the relationship between the photodetection channel and the peak wavelength attributable to the deformation of the support body.

In the spectroscopic module of one aspect of the present disclosure, each of the plurality of first terminals may be a circular electrode pad. As a result, even if the wiring unit is deformed, the stress concentration that is attributable to the deformation is mitigated at each first terminal, and thus it is possible to suppress a deviation in the relationship between the photodetection channel and the peak wavelength attributable to the deformation of the support body.

In the spectroscopic module of one aspect of the present disclosure, each of the plurality of second terminals may be a circular electrode pad. As a result, even if the wiring unit is deformed, the stress concentration that is attributable to the deformation is mitigated at each second terminal, and thus it is possible to suppress a deviation in the relationship between the photodetection channel and the peak wavelength attributable to the deformation of the support body.

In the spectroscopic module of one aspect of the present disclosure, the plurality of third terminals may be configured as a connector. As a result, the support body is not thermally affected when, for example, the wiring unit is connected to a rigid wiring substrate, and thus it is possible to suppress a deviation in the relationship between the photodetection channel and the peak wavelength.

In the spectroscopic module of one aspect of the present disclosure, the wiring unit may be configured by a flexible wiring substrate. As a result, even if the wiring unit is deformed, the stress concentration that is attributable to the deformation is unlikely to occur in the support body, and thus it is possible to suppress a deviation in the relationship between the photodetection channel and the peak wavelength attributable to the deformation of the support body. In addition, the difference in thermal expansion coefficient between the wiring unit and the support body is absorbed by the flexibility of the wiring unit, and thus it is possible to suppress a deviation in the relationship between the photodetection channel and the peak wavelength even if the temperature of the environment of use changes.

In the spectroscopic module of one aspect of the present disclosure, the wiring unit may further have a plurality of wirings respectively connecting the plurality of second terminals and the plurality of third terminals, and a support substrate, and a bending strength of the support substrate may be smaller than a bending strength of the support body. As a result, even if the wiring unit is deformed, the stress concentration that is attributable to the deformation is unlikely to occur in the support body, and thus it is possible to suppress a deviation in the relationship between the photodetection channel and the peak wavelength attributable to the deformation of the support body.

The spectroscopic module of one aspect of the present disclosure may further include a rigid wiring substrate to which the plurality of third terminals are connected. As a result, it is possible to realize an electrical connection between the photodetector and the rigid wiring substrate while reliably suppressing a decline in detection accuracy in a configuration in which the spectroscopic portion and the photodetector face each other via the space.

A method for manufacturing spectroscopic module of one aspect of the present disclosure includes a first step of preparing a spectroscope including a support body having a bottom wall portion and a side wall portion surrounding a space on one side of the bottom wall portion, a spectroscopic portion provided on the one side of the bottom wall portion and having a plurality of grating grooves, a photodetector attached to the side wall portion so as to face the spectroscopic portion via the space and having a plurality of photodetection channels, and a plurality of first terminals provided on a surface of the support body so as to be disposed along the surface of the support body and electrically connected to the photodetector, a second step of preparing a wiring unit having a plurality of second terminals and a plurality of third terminals respectively and electrically connected to the plurality of second terminals, a third step of causing the plurality of first terminals and the plurality of second terminals to face each other and joining a first terminal and a second terminal to each other after the first step and the second step, the first terminal and the second terminal facing each other in the plurality of first terminals and the plurality of second terminals, and a fourth step of acquiring a relationship between a position of each of the plurality of photodetection channels and a peak wavelength of light incident on each of the plurality of photodetection channels after the third step.

If the first terminal and the second terminal facing each other are joined to each other after, for example, the acquisition of the relationship between the photodetection channel and the peak wavelength, the support body is distorted due to the stress or the like that is generated during the joining and the acquired relationship may deviate. In contrast, in the spectroscopic module manufacturing method of one aspect of the present disclosure, the relationship between the photodetection channel and the peak wavelength is acquired after the first terminal and the second terminal facing each other are joined to each other. Therefore, according to the spectroscopic module manufacturing method of one aspect of the present disclosure, it is possible to reliably suppress a decline in detection accuracy in the manufactured spectroscopic module by performing spectroscopic analysis based on the acquired relationship.

A method for manufacturing spectroscopic module of one aspect of the present disclosure includes a first step of preparing a spectroscope including a support body having a bottom wall portion and a side wall portion surrounding a space on one side of the bottom wall portion, a spectroscopic portion provided on the one side of the bottom wall portion and having a plurality of grating grooves, a photodetector attached to the side wall portion so as to face the spectroscopic portion via the space and having a plurality of photodetection channels, and a plurality of first terminals provided on a surface of the support body so as to be disposed along the surface of the support body and electrically connected to the photodetector, a second step of preparing a wiring unit having a plurality of second terminals and a plurality of third terminals respectively and electrically connected to the plurality of second terminals and providing a joining member for each of the plurality of second terminals by heat treatment, and a third step of causing the plurality of first terminals and the plurality of second terminals to face each other and joining a first terminal and a second terminal to each other via the joining member by heat treatment after the first step and the second step, the first terminal and the second terminal facing each other in the plurality of first terminals and the plurality of second terminals.

If the joining member is provided for each of the plurality of first terminals by heat treatment and the first terminal and the second terminal facing each other are joined to each other via the joining member by heat treatment, for example, the support body is thermally affected twice, and thus the deviation that occurs in the relationship between the photodetection channel and the peak wavelength may increase. In contrast, in the spectroscopic module manufacturing method of one aspect of the present disclosure, the joining member is provided for each of the plurality of second terminals by heat treatment and the first terminal and the second terminal facing each other are joined to each other via the joining member by heat treatment, and thus the support body is thermally affected only once. Therefore, according to the spectroscopic module manufacturing method of one aspect of the present disclosure, it is possible to suppress a deviation in the relationship between the photodetection channel and the peak wavelength and reliably suppress a decline in detection accuracy in the manufactured spectroscopic module.

In the method for manufacturing spectroscopic module of one aspect of the present disclosure, a plurality of the wiring units connected to each other may be prepared in the second step and the plurality of wiring units to which the spectroscope is attached may be separated from each other after the third step. As a result, a plurality of the spectroscopic modules can be efficiently manufactured.

Advantageous Effects of Invention

According to the present disclosure, it is possible to provide a spectroscopic module and a method for manufacturing the spectroscopic module with which a decline in detection accuracy can be reliably suppressed in a configuration in which a spectroscopic portion and a photodetector face each other via a space.

BRIEF DESCRIPTION OF DRAWINGS

FIG. 12 is a perspective view of a spectroscopic module of a modification example.

DESCRIPTION OF EMBODIMENTS

Figure 1:
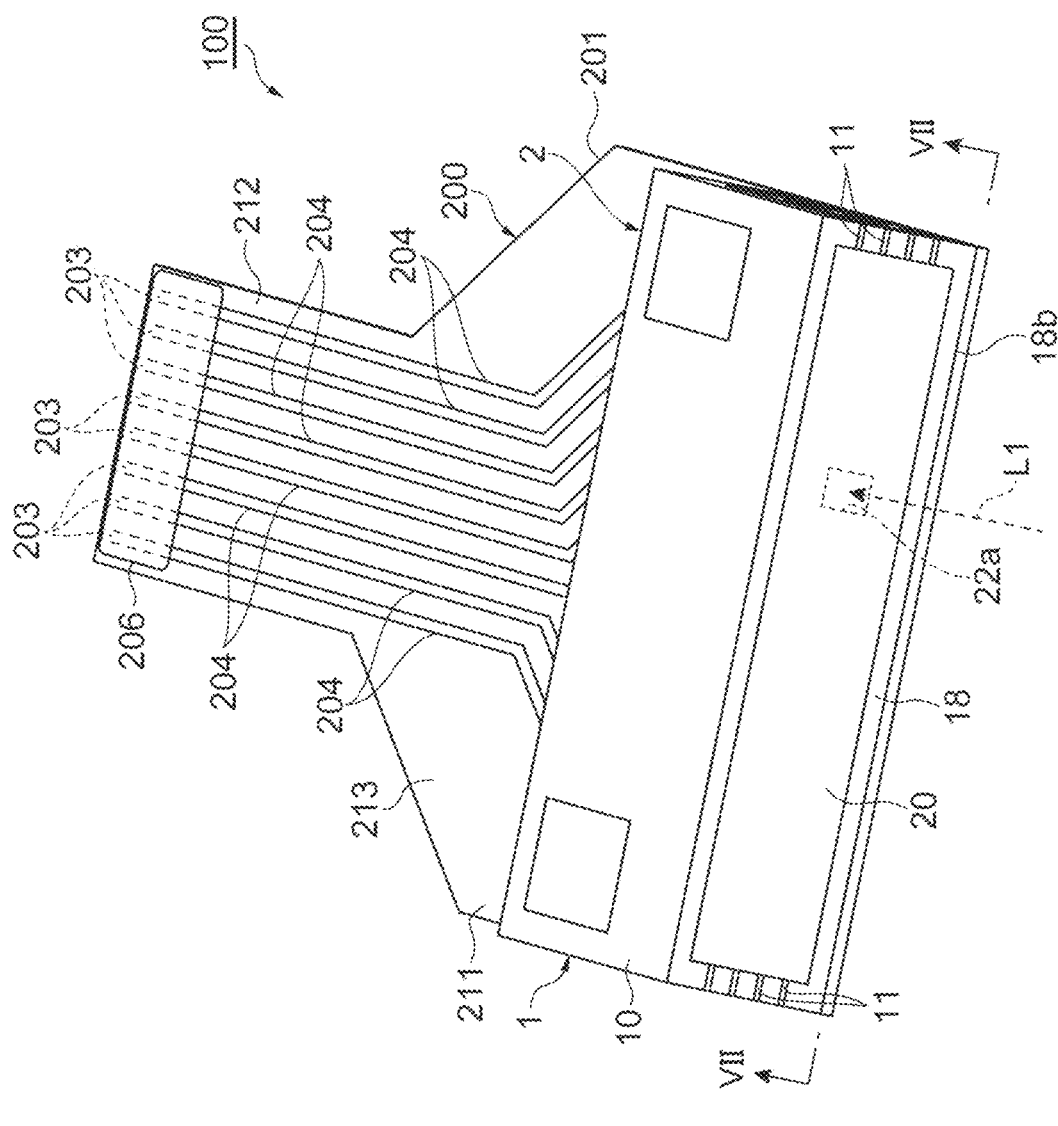
FIG. 1 is a perspective view of a spectroscopic module of one embodiment.

Hereinafter, an embodiment of the present disclosure will be described in detail with reference to the drawings. It should be noted that the same or corresponding parts in the drawings are denoted by the same reference numerals without redundant description.

Configuration of Spectroscopic Module

Figure 2:
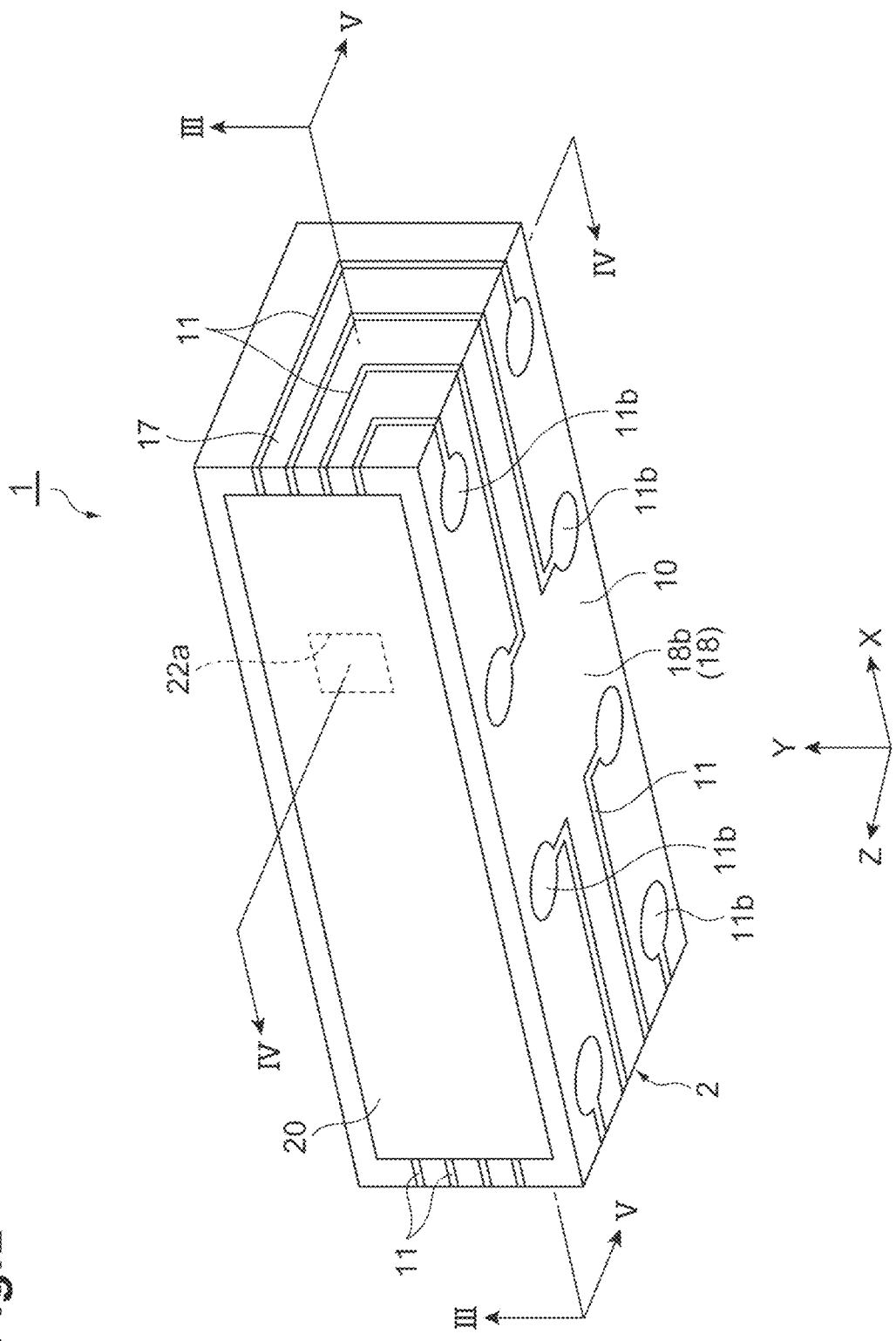
FIG. 2 is a perspective view of a spectroscope illustrated in FIG. 1.

As illustrated in FIG. 1, a spectroscopic module 100 includes a spectroscope 1 and a wiring unit 200. As illustrated in FIGS. 1 and 2, in the spectroscope 1, a box-shaped package 2 is configured by a support body 10 and a cover 20. The support body 10 is configured as a molded interconnect device (MID) and provided with a plurality of wirings 11. As an example, the spectroscope 1 has a rectangular parallelepiped shape in which the length in each of the X-axis direction, the Y-axis direction (direction perpendicular to the X-axis direction), and the Z-axis direction (direction perpendicular to the X-axis direction and the Y-axis direction) is 15 mm or less. In particular, the spectroscope 1 is thin to the extent that the length in the Y-axis direction is approximately several millimeters.

Figure 3:
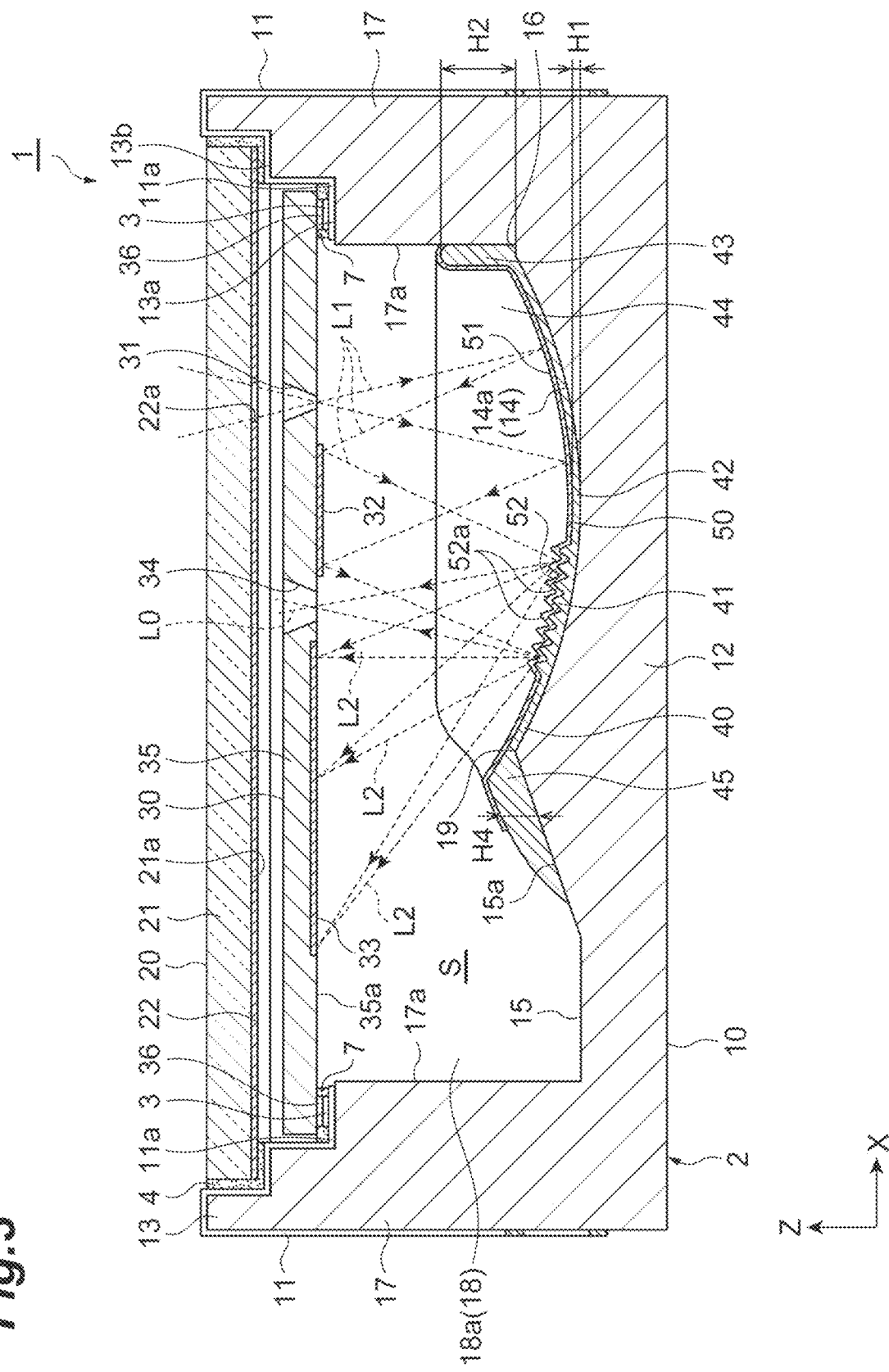
FIG. 3 is a cross-sectional view of the spectroscope taken along line III-III illustrated in FIG. 2.
Figure 4:
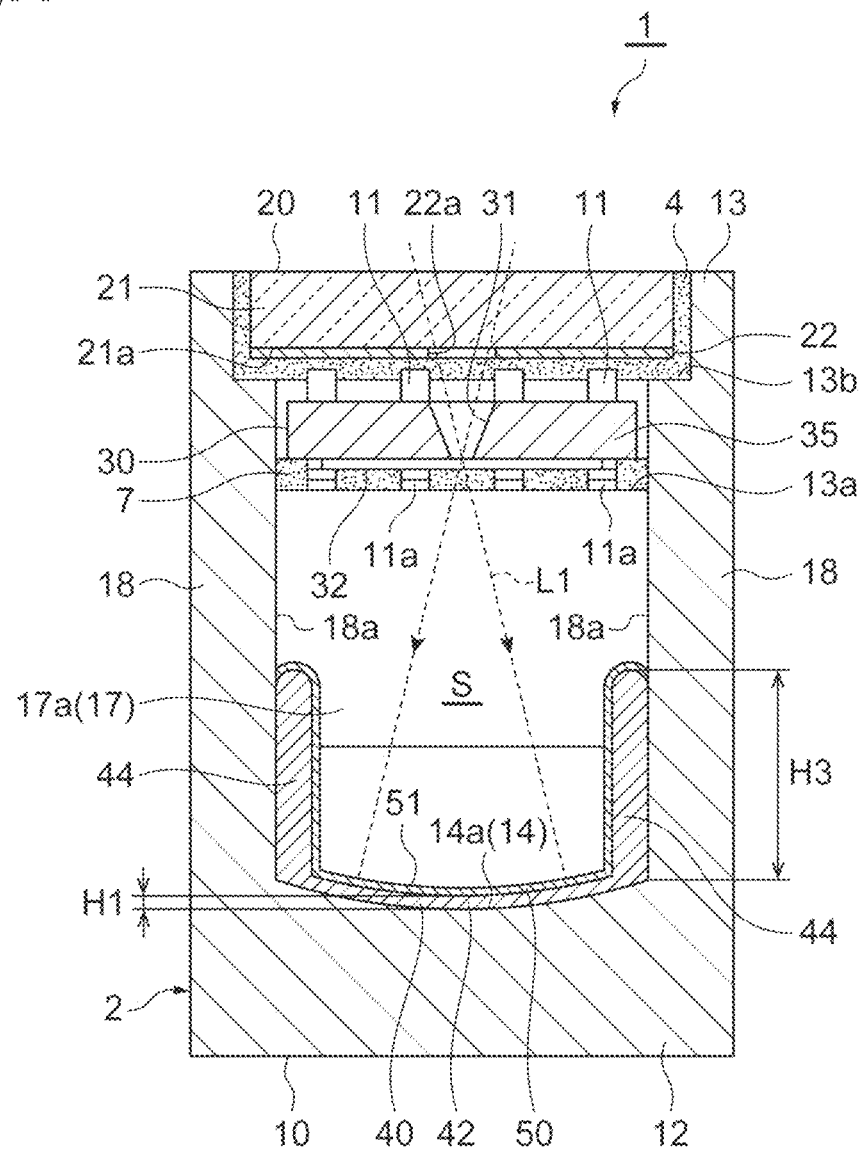
FIG. 4 is a cross-sectional view of the spectroscope taken along line IV-IV illustrated in FIG. 2.

As illustrated in FIGS. 3 and 4, a photodetector 30, a resin layer 40, and a reflective layer 50 are provided in the package 2. The reflective layer 50 is provided with a first reflection portion 51 and a spectroscopic portion 52. The photodetector 30 is provided with a light passage portion 31, a second reflection portion 32, a light detecting portion 33, and a 0th-order light capturing portion 34. The light passage portion 31, the first reflection portion 51, the second reflection portion 32, the spectroscopic portion 52, the light detecting portion 33, and the 0th-order light capturing portion 34 are arranged on the same straight line parallel to the X-axis direction when viewed from the optical axis direction of light L1 passing through the light passage portion 31 (that is, the Z-axis direction).

In the spectroscope 1, the light L1 that has passed through the light passage portion 31 is reflected by the first reflection portion 51 and the light L1 reflected by the first reflection portion 51 is reflected by the second reflection portion 32. The light L1 reflected by the second reflection portion 32 is dispersed and reflected by the spectroscopic portion 52. Of the light dispersed and reflected by the spectroscopic portion 52, light L2, which heads toward the light detecting portion 33 and is other than 0th-order light L0, is incident on the light detecting portion 33 and detected by the light detecting portion 33 and the 0th-order light L0 is incident on the 0th-order light capturing portion 34 and captured by the 0th-order light capturing portion 34. The optical path of the light L1 from the light passage portion 31 to the spectroscopic portion 52, the optical path of the light L2 from the spectroscopic portion 52 to the light detecting portion 33, and the optical path of the 0th-order light L0 from the spectroscopic portion 52 to the 0th-order light capturing portion 34 are formed in a space S in the package 2.

The support body 10 has a bottom wall portion 12 and a side wall portion 13. A depressed portion 14 and peripheral portions 15 and 16 are provided on the surface of the bottom wall portion 12 that is on the space S side. The side wall portion 13 is disposed on the side where the depressed portion 14 opens with respect to the bottom wall portion 12. The side wall portion 13 surrounds the space S on one side of the bottom wall portion 12. In the present embodiment, the side wall portion 13 has a rectangular frame shape that surrounds the depressed portion 14 and the peripheral portions 15 and 16 when viewed from the Z-axis direction. More specifically, the side wall portion 13 has a pair of first side walls 17 and a pair of second side walls 18. When viewed from the Z-axis direction, the pair of first side walls 17 face each other across the depressed portion 14 and the peripheral portions 15 and 16 in the X-axis direction. When viewed from the Z-axis direction, the pair of second side walls 18 face each other across the depressed portion 14 and the peripheral portions 15 and 16 in the Y-axis direction. The bottom wall portion 12 and the side wall portion 13 are integrally formed of resin.

The side wall portion 13 is provided with a first widened portion 13a and a second widened portion 13b. The first widened portion 13a is a stepped portion where the space S is widened only in the X-axis direction on the side opposite to the bottom wall portion 12. The second widened portion 13b is a stepped portion where the first widened portion 13a is widened in each of the X-axis direction and the Y-axis direction on the side opposite to the bottom wall portion 12. One end portion of each wiring 11 is disposed as a terminal 11a in the first widened portion 13a. Each wiring 11 reaches an outside surface 18b of one of the second side walls 18 from the first widened portion 13a via the second widened portion 13b and the outside surface of the first side wall 17 (see FIG. 2). The outside surface 18b is a part of the surface of the side wall portion 13 on the side opposite to the space S that is the surface of the support body 10 on the side opposite to the space S and is a region of the surface of the side wall portion 13 on the side opposite to the space S that extends in the X-axis direction as a longitudinal direction. On the outside surface 18b, the other end portion of each wiring 11 is disposed as a terminal (first terminal) 11b.

The wiring 11 and the plurality of terminals 11b are provided on the surface of the support body 10 so as to be disposed along the surface of the support body 10 (outside surface 18b in the present embodiment). Each terminal 11b is a circular electrode pad. The plurality of terminals 11b are electrically connected to the photodetector 30 as described later. It should be noted that the outside surface 18b provided with the plurality of terminals 11b is the flat region that has the largest area among the plurality of flat regions constituting the surface of the support body 10 on the side opposite to the space S.

Figure 5:
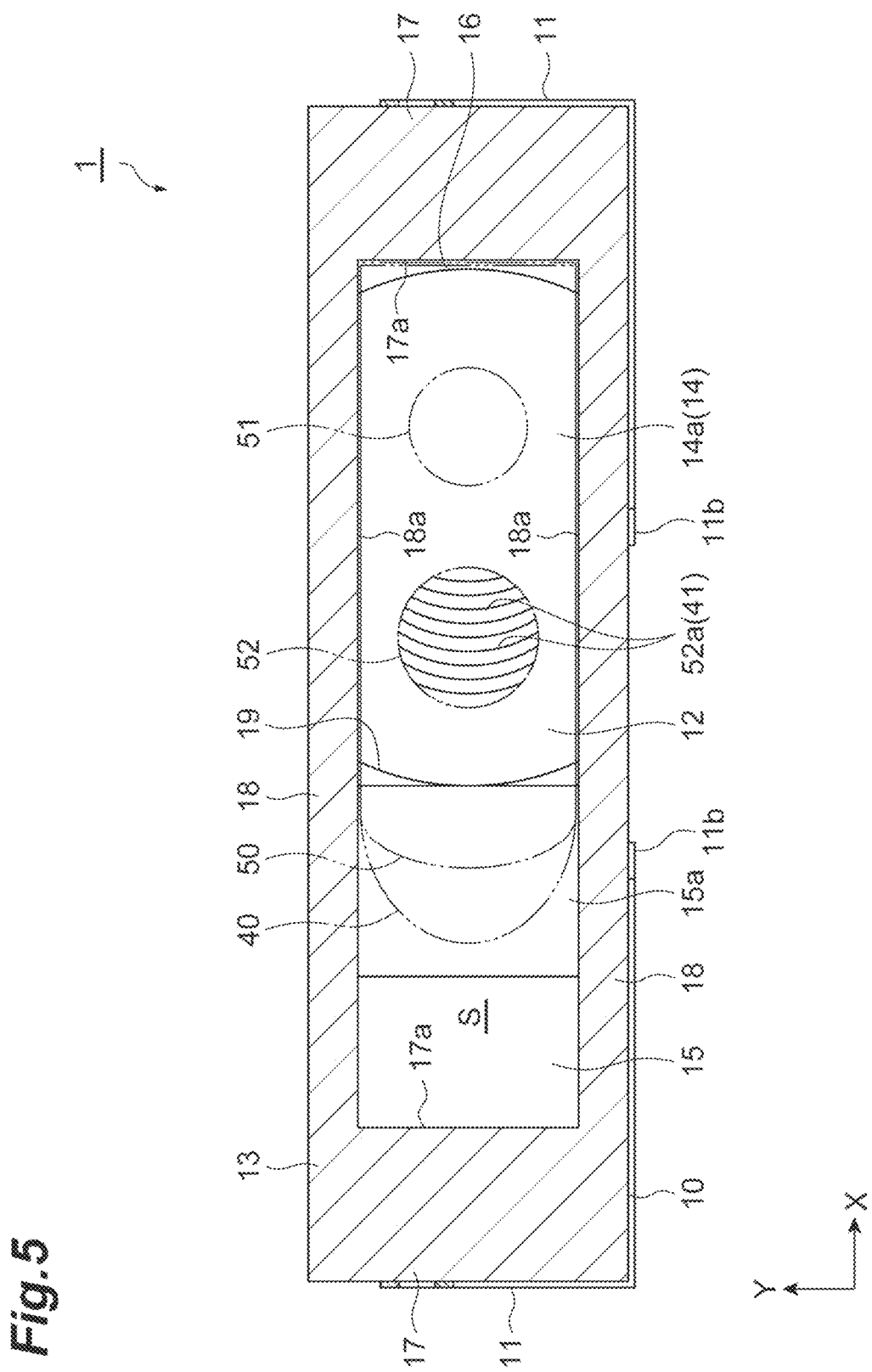
FIG. 5 is a cross-sectional view of the spectroscope taken along line V-V illustrated in FIG. 2.

As illustrated in FIGS. 3, 4, and 5, the length of the depressed portion 14 in the X-axis direction is larger than the length of the depressed portion 14 in the Y-axis direction when viewed from the Z-axis direction. The depressed portion 14 includes an inner surface 14a having a concave curved surface shape. The inner surface 14a has, for example, a shape in which both sides of a part of a spherical surface (spherical cap) are cut off in a plane parallel to the ZX plane. In this manner, the inner surface 14a is curved in a curved surface shape in each of the X-axis direction and the Y-axis direction. In other words, the inner surface 14a is curved in a curved surface shape both when viewed from the Y-axis direction (see FIG. 3) and when viewed from the X-axis direction (see FIG. 4).

The peripheral portions 15 and 16 are adjacent to the depressed portion 14 in the X-axis direction. The peripheral portion 15 is positioned on the side of one of the first side walls 17 (one side in the X-axis direction) with respect to the depressed portion 14 when viewed from the Z-axis direction. The peripheral portion 16 is positioned on the side of the other first side wall 17 (the other side in the X-axis direction) with respect to the depressed portion 14 when viewed from the Z-axis direction. When viewed from the Z-axis direction, the area of the peripheral portion 15 is larger than the area of the peripheral portion 16. In the spectroscope 1, the area of the peripheral portion 16 is narrowed to the extent that the outer edge of the inner surface 14a of the depressed portion 14 is in contact with an inside surface 17a of the other first side wall 17 when viewed from the Z-axis direction. The peripheral portion 15 includes an inclined surface 15a. The inclined surface 15a is inclined so as to be separated from the photodetector 30 along the Z-axis direction as the distance between the inclined surface 15a and the depressed portion 14 increases along the X-axis direction.

The shapes of the depressed portion 14 and the peripheral portions 15 and 16 are configured by the shape of the support body 10. In other words, the depressed portion 14 and the peripheral portions 15 and 16 are defined only by the support body 10. The inner surface 14a of the depressed portion 14 and the inside surface 17a of the one first side wall 17 are connected to each other via the peripheral portion 15 (that is, physically separated from each other). The inner surface 14a of the depressed portion 14 and the inside surface 17a of the other first side wall 17 are connected to each other via the peripheral portion 16 (that is, physically separated from each other). The inner surface 14a of the depressed portion 14 and an inside surface 18a of each second side wall 18 are connected to each other via an inter-surface intersection line (corner, bending point, or the like). In this manner, the inner surface 14a of the depressed portion 14 and the inside surfaces 17a and 18a of the side wall portion 13 are connected to each other in a discontinuous state (state of physical separation, state of interconnection via an inter-surface intersection line, or the like). When viewed from the Z-axis direction, a boundary line 19 between the depressed portion 14 and the peripheral portion 15 adjacent to each other in the X-axis direction crosses the bottom wall portion 12 along the Y-axis direction (see FIG. 5). In other words, both ends of the boundary line 19 reach the inside surface 18a of each second side wall 18.

As illustrated in FIGS. 3 and 4, the photodetector 30 has a substrate 35. The substrate 35 is formed in a rectangular plate shape and of a semiconductor material such as silicon.

The light passage portion 31 is a slit provided in the substrate 35 and extends in the Y-axis direction. The 0th-order light capturing portion 34 is a slit provided in the substrate 35, is positioned between the light passage portion 31 and the light detecting portion 33 when viewed from the Z-axis direction, and extends in the Y-axis direction. It should be noted that the end portion of the light passage portion 31 on the incident side of the light L1 spreads out toward the incident side of the light L1 in each of the X-axis direction and the Y-axis direction. In addition, the end portion of the 0th-order light capturing portion 34 on the side opposite to the incident side of the 0th-order light L0 spreads out toward the side opposite to the incident side of the 0th-order light L0 in each of the X-axis direction and the Y-axis direction. With the configuration in which the 0th-order light L0 is obliquely incident on the 0th-order light capturing portion 34, it is possible to more reliably suppress the 0th-order light L0 incident on the 0th-order light capturing portion 34 returning to the space S.

The second reflection portion 32 is provided on the region of a surface 35a of the substrate 35 on the space S side that is between the light passage portion 31 and the 0th-order light capturing portion 34. The second reflection portion 32 is a metal film such as Al and Au and functions as a plane mirror.

The light detecting portion 33 is provided on the surface 35a of the substrate 35. More specifically, the light detecting portion 33 is not attached to the substrate 35 but built into the substrate 35 made of the semiconductor material. In other words, the light detecting portion 33 is configured by a plurality of photodiodes formed by a first conductive region in the substrate 35 made of the semiconductor material and a second conductive region provided in the region. The light detecting portion 33 is configured as, for example, a photodiode array, a C-MOS image sensor, or a CCD image sensor and has a plurality of photodetection channels 33a arranged in the X-axis direction. The light L2 having a different wavelength is incident on each photodetection channel 33a of the light detecting portion 33. A plurality of terminals 36 for inputting and outputting electric signals with respect to the light detecting portion 33 are provided on the surface 35a of the substrate 35. It should be noted that the light detecting portion 33 may be configured as a surface-incident photodiode or may be configured as a backside-incident photodiode. When the light detecting portion 33 is configured as a backside-incident photodiode, the plurality of terminals 36 are provided on the surface of the substrate 35 on the side opposite to the surface 35a. Accordingly, in that case, each terminal 36 is electrically connected to the terminal 11a of the corresponding wiring 11 by wire bonding.

The photodetector 30 is disposed in the first widened portion 13a of the side wall portion 13. The terminal 36 of the photodetector 30 and the terminal 11a of the wiring 11 facing each other in the first widened portion 13a are connected to each other by a solder layer 3. As an example, the terminal 36 of the photodetector 30 and the terminal 11a of the wiring 11 facing each other are connected to each other by the solder layer 3 formed on the surface of the terminal 36 via a plating layer of a base (Ni—Au, Ni—Pd—Au, or the like). In this case, in the spectroscope 1, the photodetector 30 and the side wall portion 13 are fixed to each other by the solder layer 3 and the light detecting portion 33 of the photodetector 30 and the plurality of wirings 11 are electrically connected to each other. A reinforcing member 7 made of resin or the like is disposed between the photodetector 30 and the first widened portion 13a so as to cover the connection portion between the terminal 36 of the photodetector 30 and the terminal 11a of the wiring 11 facing each other. In this manner, the photodetector 30 is attached to the side wall portion 13 surrounding the space S when viewed from the Z-axis direction. In other words, the photodetector 30 is attached to the side wall portion 13 so as to face the depressed portion 14 (that is, so as to face the spectroscopic portion 52) via the space S. It should be noted that the Z-axis direction is a first direction in which the spectroscopic portion 52 and the photodetector 30 face each other in the spectroscope 1.

The resin layer 40 is disposed on the inner surface 14a of the depressed portion 14. The resin layer 40 is formed by a resin material that is a molding material being cured (photocuring by UV light or the like, thermosetting, or the like) with a molding die pressed against the resin material (photocurable epoxy resin, acrylic resin, fluororesin, silicone, optical resin for replica such as organic-inorganic hybrid resin, or the like).

A grating pattern 41 is provided on the region of the resin layer 40 that is offset to the peripheral portion 15 side (one side in the X-axis direction) with respect to the center of the depressed portion 14 when viewed from the Z-axis direction. The grating pattern 41 corresponds to, for example, a blazed grating having a serrated cross section, a binary grating having a rectangular cross section, or a holographic grating having a sinusoidal cross section.

The resin layer 40 is separated from the inside surface 17a of the one first side wall 17 (first side wall 17 on the left side in FIG. 3) and is in contact with the inside surface 17a of the other first side wall 17 (first side wall 17 on the right side in FIG. 3), the inside surface 18a of the one second side wall 18, and the inside surface 18a of the other second side wall 18. The resin layer 40 extends along the inside surface 17a of the other first side wall 17, the inside surface 18a of the one second side wall 18, and the inside surface 18a of the other second side wall 18 so as to crawl up the inside surfaces 17a and 18a from the inner surface 14a.

The thickness of the resin layer 40 in the Z-axis direction is larger at a part 43 in contact with the inside surface 17a and a part 44 in contact with the inside surface 18a than at a part 42 disposed on the inner surface 14a. In other words, "Z-axis-direction thickness H2" of the part 43 of the resin layer 40 in contact with the inside surface 17a and "Z-axis-direction thickness H3" of the part 44 of the resin layer 40 in contact with the inside surface 18a are larger than "Z-axis-direction thickness H1" of the part 42 of the resin layer 40 disposed on the inner surface 14a. As an example, H1 is approximately several micrometers to 80 μm (the minimum value being at least a thickness at which the surface roughness of the support body 10 can be filled) and H2 and H3 are approximately several hundred micrometers each.

The resin layer 40 reaches the top of the inclined surface 15a of the peripheral portion 15. The thickness of the resin layer 40 in the Z-axis direction is larger at a part 45 reaching the peripheral portion 15 than at the part 42 disposed on the inner surface 14a. In other words, "Z-axis-direction thickness H4" of the part 45 of the resin layer 40 reaching the peripheral portion 15 is larger than "Z-axis-direction thickness H1" of the part 42 of the resin layer 40 disposed on the inner surface 14a. As an example, H4 is approximately several hundred micrometers.

Here, when "Z-axis-direction thickness" changes at each of the parts 42, 43, 44, and 45, the average value of the thicknesses of the parts 42, 43, 44, and 45 can be regarded as "Z-axis-direction thickness" of each of the parts 42, 43, 44, and 45. It should be noted that "thickness along the direction perpendicular to the inside surface 17a" of the part 43 in contact with the inside surface 17a, "thickness along the direction perpendicular to the inside surface 18a" of the part 44 in contact with the inside surface 18a, and "thickness along the direction perpendicular to the inclined surface 15a" of the part 45 reaching the peripheral portion 15 are also larger than "thickness H1 along the direction perpendicular to the inner surface 14a" of the part 42 disposed on the inner surface 14a. The resin layer 40 as described above is formed in a continuous state.

The reflective layer 50 is disposed on the resin layer 40. The reflective layer 50 is a metal film such as A1 and Au. The region of the reflective layer 50 that faces the light passage portion 31 of the photodetector 30 in the Z-axis direction is the first reflection portion 51 functioning as a concave mirror. The first reflection portion 51 is disposed on the inner surface 14a of the depressed portion 14 and is offset to the peripheral portion 16 side (the other side in the X-axis direction) with respect to the center of the depressed portion 14 when viewed from the Z-axis direction. The region of the reflective layer 50 that covers the grating pattern 41 of the resin layer 40 is the spectroscopic portion 52 functioning as a reflective grating. The spectroscopic portion 52 is disposed on the inner surface 14a of the depressed portion 14 and is offset to the peripheral portion 15 side (one side in the X-axis direction) with respect to the center of the depressed portion 14 when viewed from the Z-axis direction. In this manner, the first reflection portion 51 and the spectroscopic portion 52 are provided on the resin layer 40 on the inner surface 14a of the depressed portion 14. In other words, the spectroscopic portion 52 is provided on one side of the bottom wall portion 12 so as to face the photodetector 30 via the space S.

A plurality of grating grooves 52a of the spectroscopic portion 52 have a shape that follows the shape of the grating pattern 41. The plurality of grating grooves 52a are arranged in the X-axis direction when viewed from the Z-axis direction and are curved in a curve shape on the same side (for example, in a convex arc shape on the peripheral portion 15 side) when viewed from the Z-axis direction (see FIG. 5). It should be noted that the X-axis direction is a second direction that is perpendicular to the first direction and in which the plurality of grating grooves 52a are arranged and the Y-axis direction is a third direction perpendicular to the first direction and the second direction in the spectroscope 1.

The reflective layer 50 covers the entire part 42 (including the grating pattern 41) of the resin layer 40 disposed on the inner surface 14a of the depressed portion 14, the entire part 43 of the resin layer 40 in contact with the inside surface 17a of the other first side wall 17, the entire part 44 of the resin layer 40 in contact with the inside surface 18a of each second side wall 18, and a part of the part 45 reaching the peripheral portion 15. In other words, the reflective layer 50 constituting the first reflection portion 51 and the spectroscopic portion 52 is disposed on the resin layer 40 in a continuous state.

The cover 20 has a light transmitting member 21 and a light shielding film 22. The light transmitting member 21 has a rectangular plate shape and is made of a material that transmits the light L1 such as quartz, borosilicate glass (BK7), Pyrex (registered trademark) glass, and Kovar glass. The light shielding film 22 is provided on a surface 21a on the space S side of the light transmitting member 21. The light shielding film 22 is provided with a light passage opening 22a so as to face the light passage portion 31 of the photodetector 30 in the Z-axis direction. The light passage opening 22a is a slit provided in the light shielding film 22 and extends in the Y-axis direction.

It should be noted that silicon, germanium, or the like is also effective as the material of the light transmitting member 21 when infrared rays are detected. In addition, anti-reflection (AR) coating may be performed on the light transmitting member 21 or the light transmitting member 21 may be provided with a filter function to transmit only light having a predetermined wavelength. In addition, a black resist, A1, or the like can be used as the material of the light shielding film 22. The black resist is particularly effective as the material of the light shielding film 22 from the viewpoint of suppressing the return of the 0th-order light L0 incident on the 0th-order light capturing portion 34 to the space S. As an example, the light shielding film 22 may be a composite film including an Al layer covering the surface 21a of the light transmitting member 21 and a black resist layer provided in the region of the AL layer that faces at least the 0th-order light capturing portion 34. In other words, in the composite film, the Al layer and the black resist layer are laminated in this order on the space S side of the light transmitting member 21.

The cover 20 is disposed in the second widened portion 13b of the side wall portion 13. A sealing member 4 made of resin, solder, or the like is disposed between the cover 20 and the second widened portion 13b. In the spectroscope 1, the space S is airtightly sealed and the cover 20 and the side wall portion 13 are fixed to each other by the sealing member 4.

Figure 6:
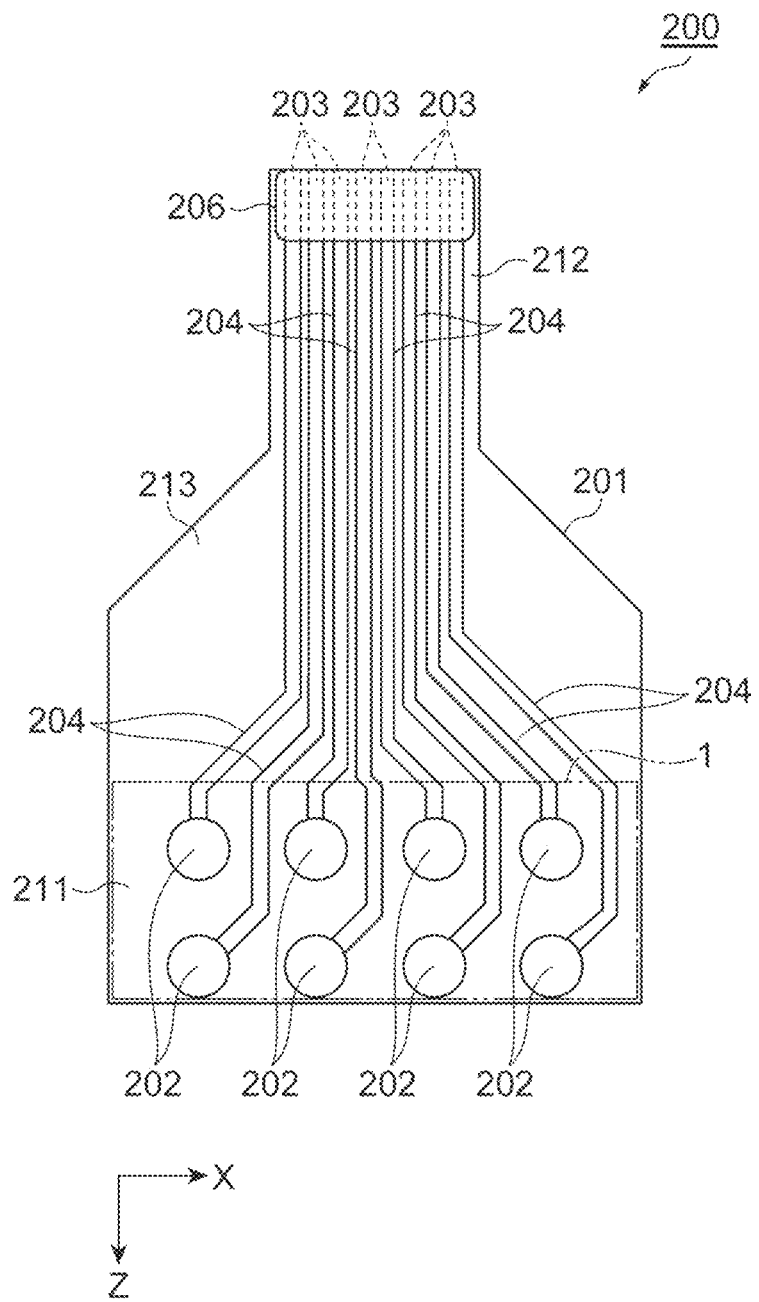
FIG. 6 is a plan view of a wiring unit illustrated in FIG. 1.

As illustrated in FIGS. 1 and 6, the wiring unit 200 has a support substrate 201, a plurality of terminals (second terminals) 202, a plurality of terminals (third terminals) 203, and a plurality of wirings 204. The support substrate 201 is a flexible substrate, formed in a film shape, and formed of an insulating resin or the like. In the present embodiment, the bending strength of the support substrate 201 is smaller than the bending strength of the support body 10. The plurality of terminals 202, the plurality of terminals 203, and the plurality of wirings 204 are provided on the support substrate 201.

The support substrate 201 has a first part 211, a second part 212, and a third part 213. The plurality of terminals 202 are provided at the first part 211. The plurality of terminals 203 are provided at the second part 212. The third part 213 is positioned between the first part 211 and the second part 212. The width of the first part 211 in the width direction perpendicular to the length direction in which the first part 211 and the second part 212 are arranged (X-axis direction in the present embodiment) is larger than the width of the second part 212 in the width direction. The width of the third part 213 in the width direction changes from the width of the second part 212 to the width of the first part 211. In other words, the width of the third part 213 in the width direction increases toward the first part 211. The length of the first part 211 in the length direction in which the first part 211 and the second part 212 are arranged (Z-axis direction in the present embodiment) is larger than the length of the second part 212 in the length direction.

Figure 7:
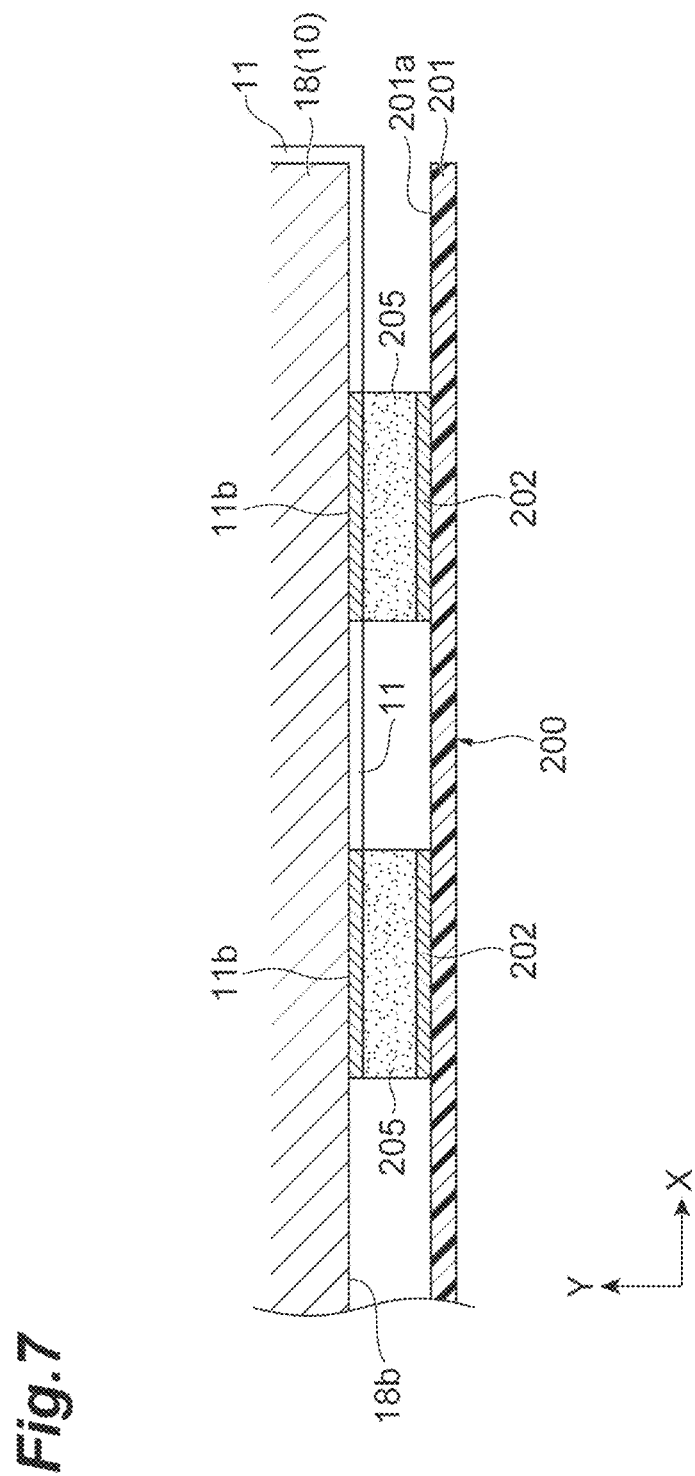
FIG. 7 is a cross-sectional view of a part of the spectroscopic module taken along line VII-VII illustrated in FIG. 1.

As illustrated in FIG. 7, the plurality of terminals 202 are disposed on a surface 201a on the support body 10 side of the support substrate 201 so as to respectively face the plurality of terminals 11b provided on the surface of the support body 10. Each terminal 202 is a circular electrode pad. The terminal 11b and the terminal 202 facing each other are joined to each other via a joining member 205. In the present embodiment, the joining member 205 is a solder layer. The joining member 205 holds the gap (such as a gap of approximately 100 µm) that is formed between the support body 10 and the wiring unit 200 (specifically, between the outside surface 18b of the one second side wall 18 and the surface 201a of the support substrate 201). The gap is a space where resin or the like is not disposed.

As illustrated in FIGS. 1 and 6, the plurality of terminals 203 are configured as a connector 206. In the present embodiment, the connector 206 is disposed on the side opposite to the incident side of the light L1 in the Z-axis direction with respect to the outside surface 18b of the one second side wall 18. The plurality of wirings 204 extend over the first part 211, the second part 212, and the third part 213 so as to respectively connect the plurality of terminals 202 and the plurality of terminals 203 to each other. In other words, the plurality of terminals 203 are electrically connected to the plurality of terminals 202, respectively. It should be noted that the part of connection to the connection destination decreases in size as the width of the second part 212 decreases and the extra space can be reduced as a result. In order to realize such a configuration, it is preferable that the width of each wiring 204 (width in the X-axis direction) is larger than the distance between the wirings 204 adjacent to each other (distance in the X-axis direction) at least at the second part 212. In addition, at the third part 213, it is preferable that the total value of the widths of the plurality of wirings 204 (widths in the X-axis direction) is 60% or more of the maximum width of the third part 213 (maximum width in the X-axis direction). In addition, although the number of the wirings 204 is eight in the example illustrated in FIG. 6, the number of the wirings 204 may be a plural number (two or more) and may be nine or more. However, the number of the wirings 204 is preferably 10 or less considering size reduction, durability, and so on.

The spectroscope 1 is disposed along the outer edge of the first part 211 on the side opposite to the second part 212. When viewed from the Y-axis direction, the first part 211 includes the spectroscope 1 and extends so as to project (protrude) from the spectroscope 1 to the second part 212 side. The connector 206 is disposed along the outer edge of the second part 212 on the side opposite to the first part 211. When viewed from the Y-axis direction, the second part 212 includes the connector 206 and extends so as to project (protrude) from the connector 206 to the first part 211 side.

It should be noted that the first part 211 overlaps at least the space S of the spectroscope 1 and the plurality of terminals 11b and the plurality of terminals 202 are joined to each other in the region where the first part 211 and the spectroscope 1 overlap in the spectroscopic module 100 when viewed from the Y-axis direction. In the present embodiment, the plurality of terminals 11b are disposed so as to surround the space S when viewed from the Y-axis direction and a part of each terminal 11b overlaps the bottom wall portion 12, the pair of first side walls 17, and the photodetector 30 when viewed from the Y-axis direction. In addition, in the spectroscopic module 100, the first part 211 does not project (protrude) to the side other than the second part 212 side with respect to the spectroscope 1 when viewed from the Y-axis direction.

In the present embodiment, the wiring unit 200 is configured by a flexible wiring substrate. In other words, the wiring unit 200 can be repeatedly deformed (bent or twisted) and has a property of maintaining its electrical characteristics even when deformed. In the spectroscopic module 100, an electric signal is input and output with respect to the light detecting portion 33 of the photodetector 30 via the wiring unit 200 and the plurality of wirings 11 by the connector 206 of the wiring unit 200 being connected to, for example, an external rigid wiring substrate.

Method for Manufacturing Spectroscopic Module

Figure 8:
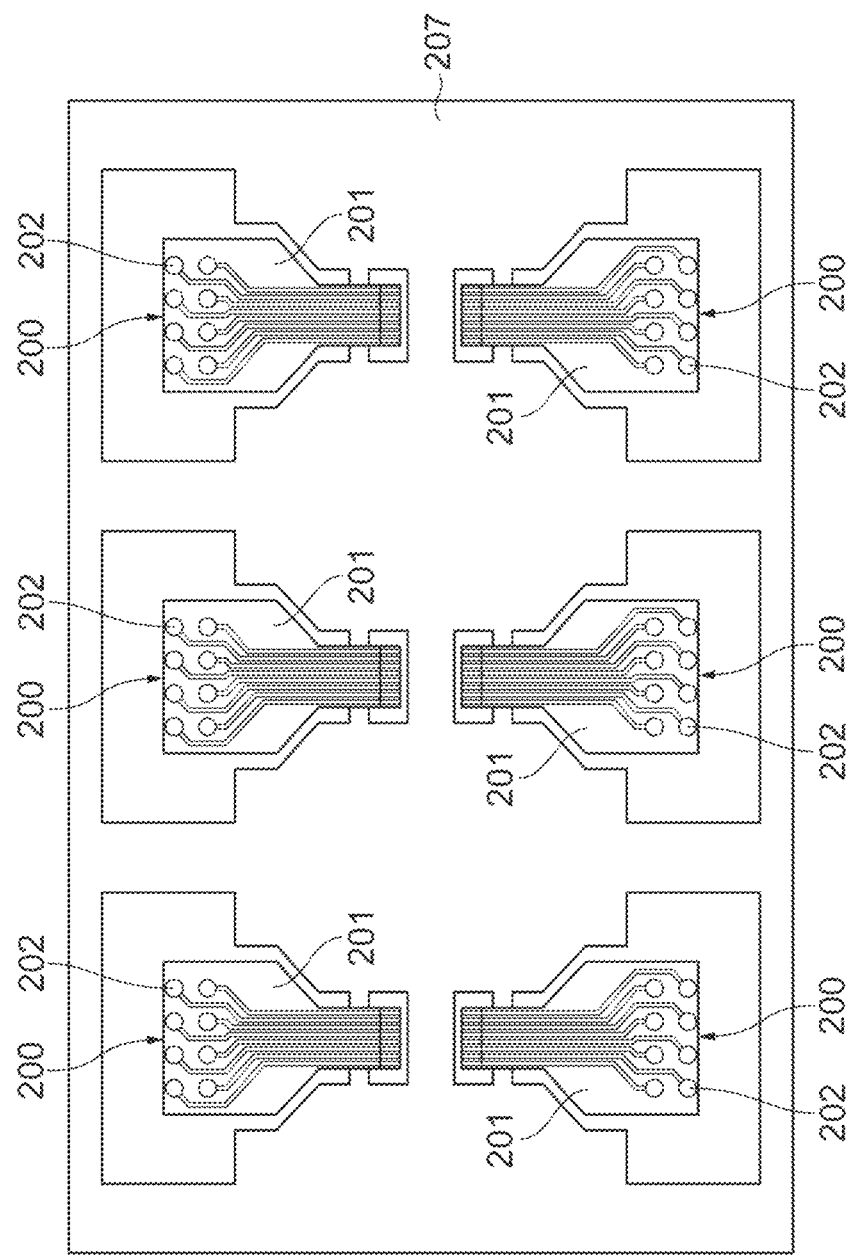
FIG. 8 is a diagram illustrating one step of a method for manufacturing the spectroscopic module illustrated in FIG. 1.
Figure 9:
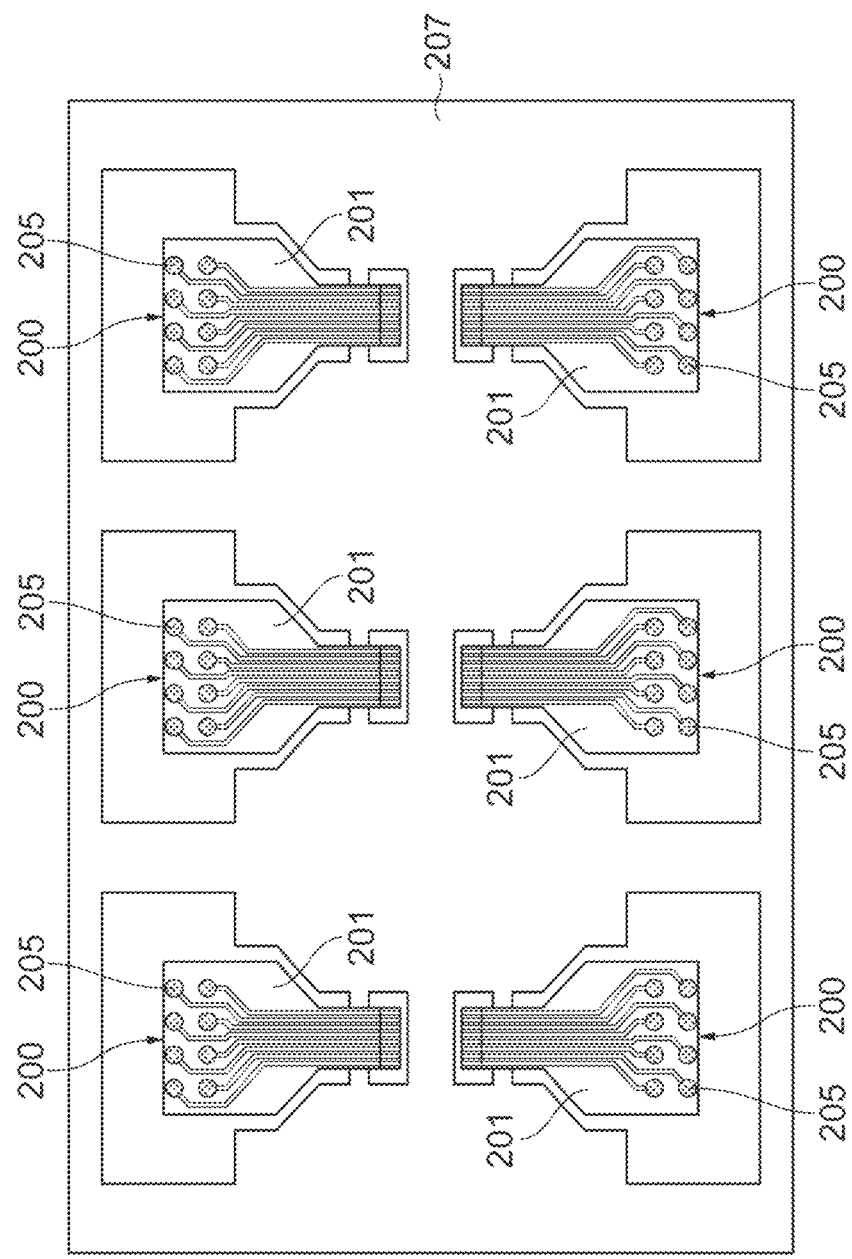
FIG. 9 is a diagram illustrating one step of the method for manufacturing the spectroscopic module illustrated in FIG. 1.

The spectroscope 1 described above is prepared (first step). Meanwhile, the wiring unit 200 described above is prepared as illustrated in FIG. 8 and the joining member 205 is provided at each terminal 202, by heat treatment such as solder paste printing and temporary solder ball fixing, as illustrated in FIG. 9 (second step). In the present embodiment, a plurality of the wiring units 200 that are connected to each other are prepared. The plurality of wiring units 200 are connected to each other via a frame portion 207 formed integrally with the support substrate 201. It should be noted that the order of implementation of the first step and the second step is not particularly limited.

Figure 10:
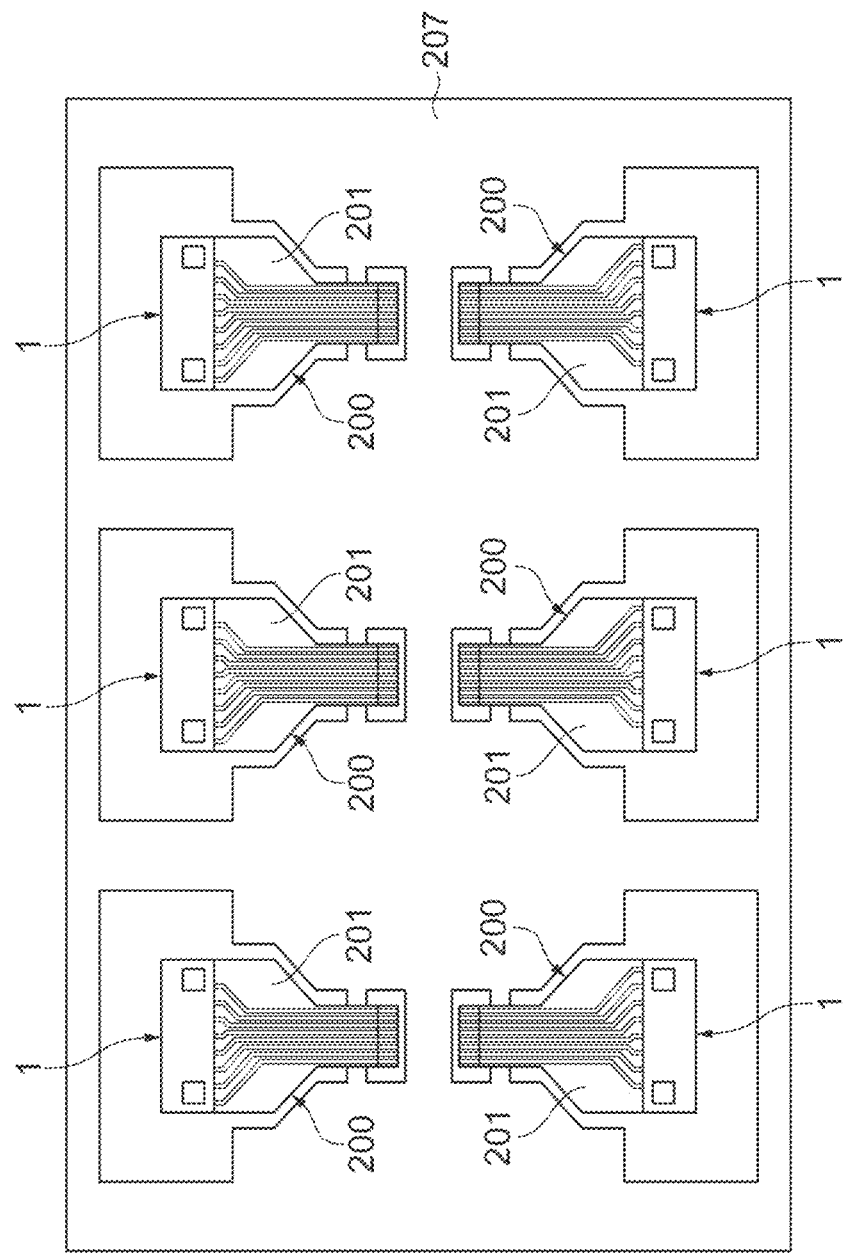
FIG. 10 is a diagram illustrating one step of the method for manufacturing the spectroscopic module illustrated in FIG. 1.
Figure 11:
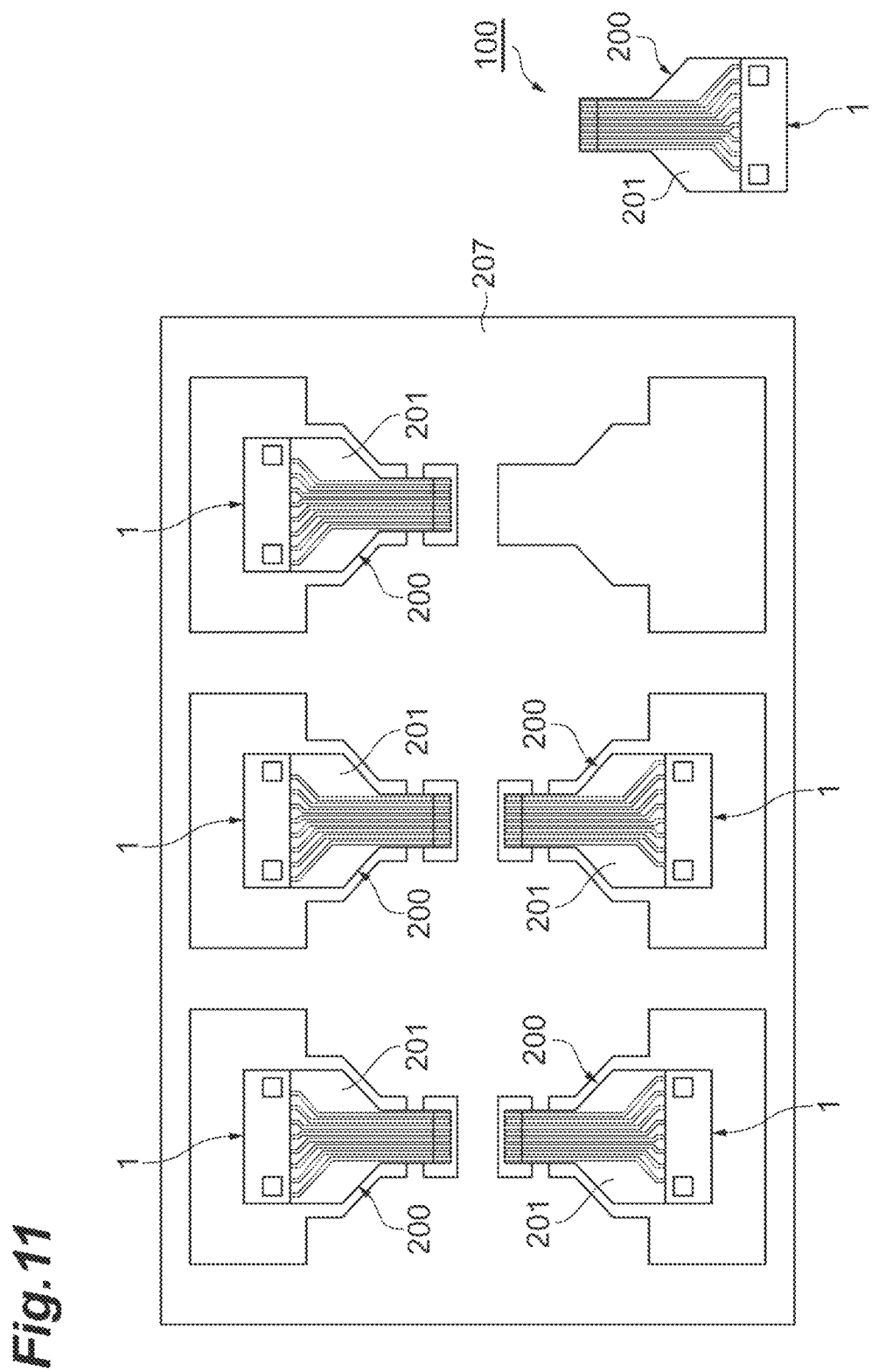
FIG. 11 is a diagram illustrating one step of the method for manufacturing the spectroscopic module illustrated in FIG. 1.

Subsequently, the spectroscope 1 is placed on each wiring unit 200 such that the terminal 11b and the terminal 202 facing each other face each other via the joining member 205 (see FIG. 7) (that is, the plurality of terminals 11b and the plurality of terminals 202 are caused to face each other) and, as illustrated in FIG. 10, the terminal 11b and the terminal 202 facing each other are joined to each other via the joining member 205 by reflow (that is, heat treatment) (third step). At this time, since the spectroscope 1 is small in size and weight, the spectroscope 1 is self-aligned with respect to the wiring unit 200, such that the terminal 11b and the terminal 202 facing each other match each other, by the tension of the molten joining member 205. Subsequently, as illustrated in FIG. 11, the plurality of wiring units 200 to which the spectroscope 1 is attached are separated from each other by being cut out from the frame portion 207.

Subsequently, the relationship between the position (coordinates) of each photodetection channel 33a and the peak wavelength of the light L2 incident on each photodetection channel 33a (hereinafter, sometimes simply referred to as "relationship between the photodetection channel 33a and the peak wavelength") is acquired in each spectroscopic module 100 (fourth step). Specifically, light having a known peak wavelength is incident on the spectroscopic module 100 and the position of the photodetection channel 33a at which the detected value peaks is acquired. This is performed with regard to a plurality of known peak wavelengths and an approximate expression (such as a fifth-order polynomial) indicating the relationship between the photodetection channel 33a and the peak wavelength is acquired. The acquired approximate expression is used when spectroscopic analysis is performed by means of the spectroscopic module 100.

ACTIONS AND EFFECTS

In the spectroscopic module 100, the plurality of terminals 11b electrically connected to the photodetector 30 are provided on the surface of the support body 10 and the plurality of terminals 202 of the wiring unit 200 respectively face the plurality of terminals 11b and are respectively joined to the plurality of terminals 11b. In a configuration in which a plurality of terminals of a rigid wiring substrate are respectively joined to the plurality of terminals 11b, for example, the support body 10 is distorted due to the stress or the like that is generated during the joining or the support body 10 is distorted due to the thermal strain or the like that is generated on the rigid wiring substrate after the joining, and thus the positional relationship between the spectroscopic portion 52 and the photodetector 30 may deviate and the relationship between the photodetection channel 33a and the peak wavelength may deviate. In contrast, in the spectroscopic module 100, the electrical connection between the photodetector 30 and the rigid wiring substrate can be realized via the wiring unit 200, and thus it is possible to suppress the deviation in the relationship between the photodetection channel 33a and the peak wavelength. Accordingly, with the spectroscopic module 100, it is possible to reliably suppress a decline in detection accuracy in the configuration in which the spectroscopic portion 52 and the photodetector 30 face each other via the space S.

It should be noted that the support body 10 in the spectroscopic module 100 has the bottom wall portion 12 provided with the spectroscopic portion 52 and the side wall portion 13 to which the photodetector 30 is attached such that the spectroscopic portion 52 and the photodetector 30 face each other via the space S. As a result, the spectroscopic portion 52 and the photodetector 30 can be stably supported and it is possible to easily form the space S that includes an optical path reaching the spectroscopic portion 52 from the outside and an optical path reaching the photodetector 30 from the spectroscopic portion 52. In a configuration in which the optical path reaching the spectroscopic portion 52 from the outside and the optical path reaching the photodetector 30 from the spectroscopic portion 52 are formed in the space S as described above, the relationship between the photodetection channel 33a and the peak wavelength is likely to deviate, and thus the configuration of the spectroscopic module 100 described above is particularly effective. In addition, the relationship between the photodetection channel 33a and the peak wavelength is likely to deviate also in a configuration in which the support body 10 defining the space S is formed of resin, and thus the configuration of the spectroscopic module 100 described above is particularly effective.

In addition, in the spectroscopic module 100, the plurality of terminals 11b are provided on the flat region (outside surface 18b of the one second side wall 18 in the present embodiment) that has the largest area among the plurality of flat regions constituting the surface of the support body 10. As a result, it is possible to improve the degree of freedom in terms of the shape of each terminal 11b, the disposition of the plurality of terminals 11b, and so on and it is possible to realize a reliable joining between the terminal 11b and the terminal 202 facing each other.

In addition, in the spectroscopic module 100, the plurality of terminals 11b are provided on the surface of the side wall portion 13 on the side opposite to the space S that is the surface of the support body 10 (outside surface 18b of the one second side wall 18 in the present embodiment). By the surface of the side wall portion 13 on the side opposite to the space S being wide, it is possible to improve the degree of freedom in terms of the shape of each terminal 11b, the disposition of the plurality of terminals 11b, and so on and it is possible to realize a reliable joining between the terminal 11b and the terminal 202 facing each other.

In addition, in the spectroscopic module 100, the plurality of terminals 11b are provided on the region of the surface of the side wall portion 13 that extends in the X-axis direction, in which the plurality of grating grooves 52a are arranged, as a longitudinal direction (outside surface 18b of the one second side wall 18 in the present embodiment). By the region that extends in the X-axis direction as a longitudinal direction being wide, it is possible to improve the degree of freedom in terms of the shape of each terminal 11b, the disposition of the plurality of terminals 11b, and so on and it is possible to realize a reliable joining between the terminal 11b and the terminal 202 facing each other.

In addition, in the spectroscopic module 100, the terminal 11b and the terminal 202 facing each other are joined to each other via the joining member 205 in the plurality of terminals 11b and the plurality of terminals 202. As a result, it is possible to realize a reliable joining between the terminal 11b and the terminal 202 facing each other.

In addition, in the spectroscopic module 100, the joining member 205 is a solder layer. As a result, it is possible to easily realize a reliable joining between the terminal 11b and the terminal 202 facing each other.

In addition, in the spectroscopic module 100, the joining member 205 holds the gap that is formed between the support body 10 and the wiring unit 200. As a result, even if the wiring unit 200 is deformed, the impact of the deformation is mitigated in the gap between the support body 10 and the wiring unit 200, and thus it is possible to suppress a deviation in the relationship between the photodetection channel 33a and the peak wavelength attributable to the deformation of the support body 10. The wiring unit 200 is easily deformed when a flexible wiring substrate constitutes the wiring unit 200 or the support substrate 201 of the wiring unit 200 is smaller in bending strength than the support body 10 in particular. Accordingly, the configuration in which the gap as a space is formed between the support body 10 and the wiring unit 200 is extremely effective as a configuration capable of mitigating the impact of the wiring unit 200.

In addition, in the spectroscopic module 100, each of the plurality of terminals 11b is a circular electrode pad. As a result, even if the wiring unit 200 is deformed, the stress concentration that is attributable to the deformation is mitigated at each terminal 11b, and thus it is possible to suppress a deviation in the relationship between the photodetection channel 33a and the peak wavelength attributable to the deformation of the support body 10. Further, the impact of the stress that is generated during the joining between the terminal 11b and the terminal 202 facing each other is also mitigated at each terminal 11b, and thus it is possible to suppress a deviation in the relationship between the photodetection channel 33a and the peak wavelength attributable to the impact of the stress generated during the joining.

In addition, in the spectroscopic module 100, each of the plurality of terminals 202 is a circular electrode pad. As a result, even if the wiring unit 200 is deformed, the stress concentration that is attributable to the deformation is mitigated at each terminal 202, and thus it is possible to suppress a deviation in the relationship between the photodetection channel 33a and the peak wavelength attributable to the deformation of the support body 10. Further, the impact of the stress that is generated during the joining between the terminal 11b and the terminal 202 facing each other is also mitigated at each terminal 202, and thus it is possible to suppress a deviation in the relationship between the photodetection channel 33a and the peak wavelength attributable to the impact of the stress generated during the joining.

In addition, in the spectroscopic module 100, the plurality of terminals 203 are configured as the connector. As a result, the support body 10 is not thermally affected when, for example, the wiring unit 200 is connected to a rigid wiring substrate, and thus it is possible to suppress a deviation in the relationship between the photodetection channel 33a and the peak wavelength.

In addition, in the spectroscopic module 100, the wiring unit 200 is configured by a flexible wiring substrate. As a result, even if the wiring unit 200 is deformed, the stress concentration that is attributable to the deformation is unlikely to occur in the support body 10, and thus it is possible to suppress a deviation in the relationship between the photodetection channel 33a and the peak wavelength attributable to the deformation of the support body 10. In addition, the difference in thermal expansion coefficient between the wiring unit 200 and the support body 10 is absorbed by the flexibility of the wiring unit 200, and thus it is possible to suppress a deviation in the relationship between the photodetection channel 33a and the peak wavelength even if the temperature of the environment of use changes. In addition, stress is absorbed by the flexibility of the wiring unit 200, and thus it is possible to stabilize the joining between the terminal 11b and the terminal 202 facing each other and it is possible to reduce the residual stress that is generated during the joining between the terminal 11b and the terminal 202 facing each other. Further, the spectroscope 1 can be installed in a desired direction.

It should be noted that high accuracy is required with regard to the orientation and position of the spectroscope 1 with respect to an installation target in the spectroscope 1 in which one side is as short as 15 mm or less as described above (particularly in the spectroscope 1 in which the length in the Y-axis direction is as small as approximately several millimeters). In addition, when the installation target is deformed, the relationship between the photodetection channel 33a and the peak wavelength may deviate due to the deformation. When the electrode pad provided on the surface of the support body 10 is joined to the electrode pad of the wiring substrate in such a situation with regard to the spectroscope 1 described above, a rigid wiring substrate that is unlikely to deform has been selected as a wiring substrate and a flexible wiring substrate that is likely to deform has not been selected. In the spectroscopic module 100, it is possible to realize the high accuracy required with regard to the orientation and position of the spectroscope 1 with respect to the installation target and suppression of the deviation in the relationship between the photodetection channel 33a and the peak wavelength by deliberately adopting the wiring unit 200 configured by a flexible wiring substrate.

In addition, in the spectroscopic module 100, the bending strength of the support substrate 201 of the wiring unit 200 is smaller than the bending strength of the support body 10. As a result, even if the wiring unit 200 is deformed, the stress concentration that is attributable to the deformation is unlikely to occur in the support body 10, and thus it is possible to suppress a deviation in the relationship between the photodetection channel 33a and the peak wavelength attributable to the deformation of the support body 10. In addition, the difference in thermal expansion coefficient between the wiring unit 200 and the support body 10 is absorbed by the flexibility of the wiring unit 200, and thus it is possible to suppress a deviation in the relationship between the photodetection channel 33a and the peak wavelength even if the temperature of the environment of use changes. In addition, stress is absorbed by the flexibility of the wiring unit 200, and thus it is possible to stabilize the joining between the terminal 11b and the terminal 202 facing each other and it is possible to reduce the residual stress that is generated during the joining between the terminal 11b and the terminal 202 facing each other.

In addition, in the spectroscopic module 100, the support substrate 201 of the wiring unit 200 has the first part 211 provided with the plurality of terminals 202, the second part 212 provided with the plurality of terminals 203, and the third part 213 positioned between the first part 211 and the second part 212 and the width of the third part 213 in the width direction perpendicular to the length direction in which the first part 211 and the second part 212 are arranged increases toward the first part 211. As a result, even if an external force is applied to the second part 212, the external force is absorbed by the third part 213, and thus it is possible to suppress the external force having an impact on the support body 10 of the spectroscope 1. In addition, stress concentration at the connector 206 is also suppressed by the support substrate 201 of the wiring unit 200 being provided with the third part 213. Further, the length of the second part 212 in the length direction in which the first part 211 and the second part 212 are arranged is smaller than the length of the first part 211 in the length direction, and thus the handling of the spectroscopic module 100 by means of the support substrate 201 of the wiring unit 200 is facilitated. It should be noted that the handling of the spectroscopic module 100 by means of the support substrate 201 of the wiring unit 200 is facilitated when the length of the second part 212 in the length direction in which the first part 211 and the second part 212 are arranged is smaller than the sum of the length of the first part 211 in the length direction and the length of the third part 213 in the length direction.

It should be noted that the support substrate 201 of the wiring unit 200 being grippable in the handling of the spectroscopic module 100 is extremely effective, regardless of whether or not the support substrate 201 of the wiring unit 200 is provided with the third part 213, when the spectroscope 1 is reduced in size to the extent that the length of one side is 15 mm or less as described above. When the support substrate 201 of the wiring unit 200 is provided with the third part 213 in particular, it is possible to handle the spectroscopic module 100 without touching the wiring 204 of the wiring unit 200 and the spectroscope 1.

In addition, in the spectroscopic module 100, the first part 211 overlaps at least the space S of the spectroscope 1 and the plurality of terminals 11b and the plurality of terminals 202 are joined to each other in the region where the first part 211 and the spectroscope 1 overlap when viewed from the Y-axis direction. As a result, when the support substrate 201 of the wiring unit 200 is gripped in the handling of the spectroscopic module 100, the wiring unit 200 being inadvertently bent due to the weight of the spectroscope 1 is suppressed and the handleability of the spectroscopic module 100 is improved. Further, in the present embodiment, the plurality of terminals 11b are disposed so as to surround the space S when viewed from the Y-axis direction and at least a part of each terminal 11b overlaps the bottom wall portion 12, the pair of first side walls 17, and the photodetector 30 when viewed from the Y-axis direction. As a result, it is possible to suppress the distortion of the support body 10 that is attributable to the stress generated during and after the joining between the terminal 11b and the terminal 202 facing each other.

In addition, in the spectroscopic module 100, the first part 211 does not project (protrude) to the side other than the second part 212 side with respect to the spectroscope 1 when viewed from the Y-axis direction. If the first part 211 significantly projects to the side other than the second part 212 side with respect to the spectroscope 1, the projecting part may, for example, come into contact with any member to result in extra load application to the spectroscopic module 100 or a decline in the handleability of the spectroscopic module 100. In contrast, in the spectroscopic module 100, the first part 211 does not project to the side other than the second part 212 side with respect to the spectroscope 1, and thus such a situation is suppressed. It should be noted that the situation described above is sufficiently suppressed, even if the first part 211 projects to the side other than the second part 212 side with respect to the spectroscope 1 when viewed from the Y-axis direction, if the area of the projecting region is smaller than the area of the region where the first part 211 and the spectroscope 1 overlap when viewed from the Y-axis direction.

In addition, the following actions and effects are derived from the method for manufacturing the spectroscopic module 100. If the terminal 11b and the terminal 202 facing each other are joined to each other after, for example, the acquisition of the relationship between the photodetection channel 33a and the peak wavelength, the support body 10 is distorted due to the stress or the like that is generated during the joining and the acquired relationship may deviate. In contrast, in the method for manufacturing the spectroscopic module 100, the relationship between the photodetection channel 33a and the peak wavelength is acquired after the terminal 11b and the terminal 202 facing each other are joined to each other. Therefore, according to the method for manufacturing the spectroscopic module 100, it is possible to reliably suppress a decline in detection accuracy in the manufactured spectroscopic module 100 by performing spectroscopic analysis based on the acquired relationship.

In addition, if the joining member 205 is provided for each of the plurality of terminals 11b by heat treatment and the terminal 11b and the terminal 202 facing each other are joined to each other via the joining member 205 by heat treatment, for example, the support body 10 is thermally affected twice, and thus the deviation that occurs in the relationship between the photodetection channel 33a and the peak wavelength may increase. In contrast, in the method for manufacturing the spectroscopic module 100, the joining member 205 is provided for each of the plurality of terminals 202 by heat treatment and the terminal 11b and the terminal 202 facing each other are joined to each other via the joining member 205 by heat treatment, and thus the support body 10 is thermally affected only once. Therefore, according to the method for manufacturing the spectroscopic module 100, it is possible to suppress a deviation in the relationship between the photodetection channel 33a and the peak wavelength and reliably suppress a decline in detection accuracy in the manufactured spectroscopic module 100.

In addition, in the method for manufacturing the spectroscopic module 100, the plurality of wiring units 200 connected to each other are prepared and the plurality of wiring units 200 to which the spectroscope 1 is attached are separated from each other after the terminal 11b and the terminal 202 facing each other are joined to each other. As a result, a plurality of the spectroscopic modules 100 can be efficiently manufactured.

MODIFICATION EXAMPLES

The present disclosure is not limited to the embodiment described above. For example, as illustrated in (a) of FIG. 12, the wiring unit 200 may be provided with an attachment portion 208 for installing the spectroscope 1. In the wiring unit 200 illustrated in (a) of FIG. 12, a pair of the attachment portions 208 are provided on both sides in the X-axis direction with respect to the outside surface 18b of the one second side wall 18. The pair of attachment portions 208 are formed integrally with the support substrate 201, and each attachment portion 208 is provided with a hole 208a through which a bolt for installing the spectroscope 1 is passed. In addition, as illustrated in (b) of FIG. 12, the connector 206 in the wiring unit 200 may be disposed on one side in the X-axis direction with respect to the outside surface 18b of the one second side wall 18. In other words, the positions of the plurality of terminals 203 with respect to the spectroscope 1 are not limited to those described above. The wiring unit 200 illustrated in (a) and (b) of FIG. 12 also has the first part 211, the second part 212, and the third part 213 as in the case of the wiring unit 200 illustrated in FIG. 1, and thus the external force applied to the second part 212 having an impact on the support body 10 of the spectroscope 1 is suppressed, stress concentration at the connector 206 is suppressed, and the handling of the spectroscopic module 100 by means of the support substrate 201 of the wiring unit 200 is facilitated as in the case of the wiring unit 200 illustrated in FIG. 1.

Figure 13:
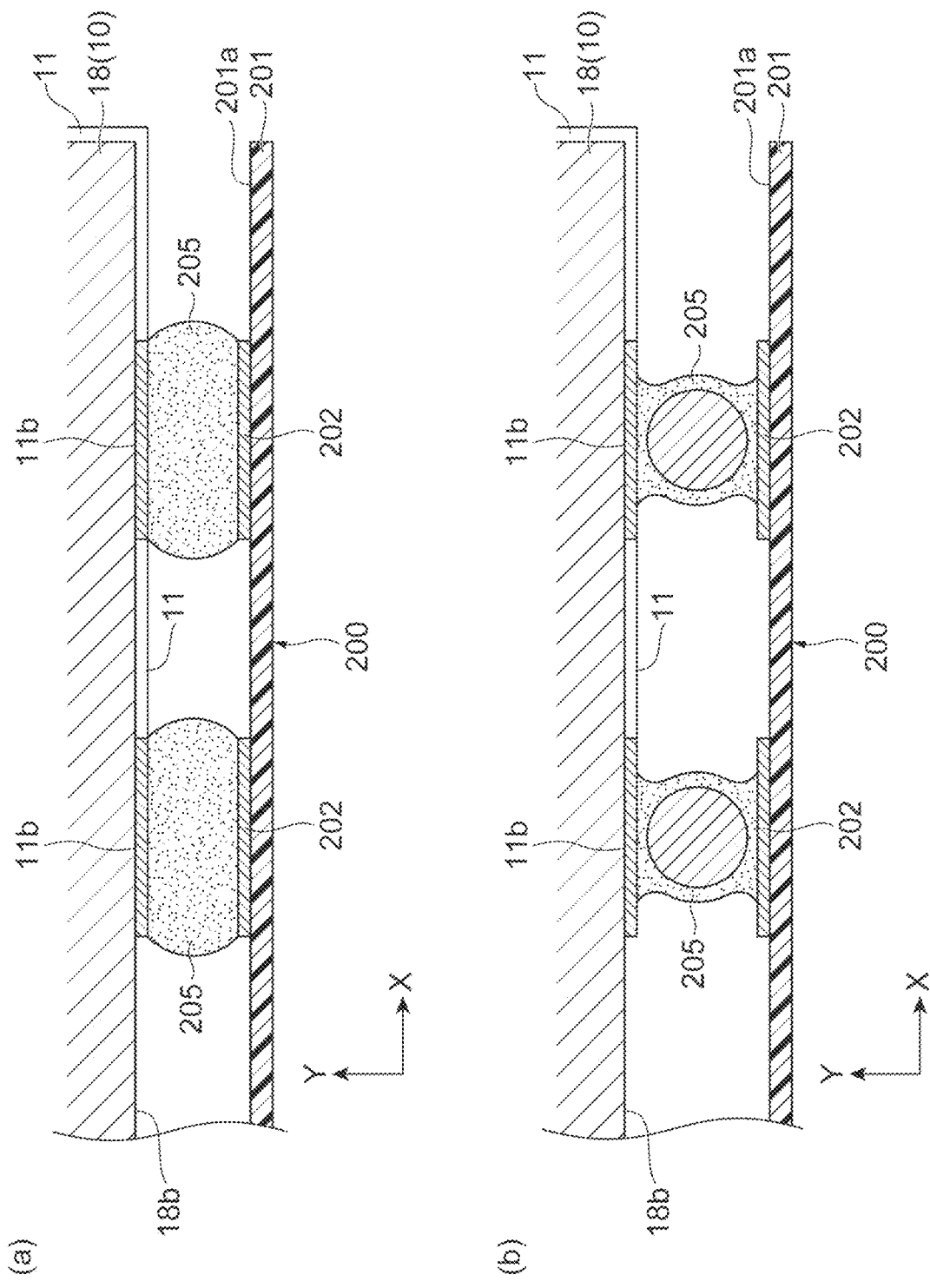
FIG. 13 is a cross-sectional view of a part of the spectroscopic module of the modification example.

In addition, by conditions such as the load on the joining member 205 being changed during the joining, for example, the side surface of the joining member 205 becomes a convex curved surface or the gap between the support body 10 and the wiring unit 200 becomes large as illustrated in (a) of FIG. 13. When the side surface of the joining member 205 is a convex curved surface, the stress generated during and after the joining between the terminal 11b and the terminal 202 facing each other is mitigated in the joining member 205 and the distortion of the support body 10 is suppressed. It should be noted that a force for pressing the spectroscope 1 to the wiring unit 200 side may be applied during the joining between the terminal 11b and the terminal 202 facing each other. For example, it is possible to adjust the shape of the side surface of the joining member 205, the size of the gap between the support body 10 and the wiring unit 200, and so on by adjusting the magnitude of the force. In addition, as illustrated in (b) of FIG. 13, the terminal 11b and the terminal 202 facing each other may be joined to each other via the joining member 205 made of a solder ball with a core. In that case, it is possible to adjust the size of the gap between the support body 10 and the wiring unit 200 by adjusting the size of the core. It should be noted that a metal core made of copper or the like, a resin core, or the like is used as the core of the solder ball with a core.

In addition, the support substrate 201 may have the first part 211 and the second part 212 without having the third part 213. In that case, the second part 212 is, for example, directly connected to the first part 211. In addition, the plurality of terminals 203 and the plurality of wirings 204 may be disposed on the back surface of the support substrate 201 (surface on the side opposite to the surface 201a). In addition, only the plurality of terminals 203 may be disposed on the back surface of the support substrate 201 (surface on the side opposite to the surface 201a). Although it is preferable that the wiring 204 is short in length, the length of the wiring 204 may have to be increased, due to a reason related to the layout of the spectroscope 1 or the like, in a configuration in which the plurality of terminals 203 are disposed on the surface 201a of the support substrate 201. In contrast, in the configuration in which the plurality of terminals 203 are disposed on the back surface of the support substrate 201 (surface on the side opposite to the surface 201a), it may be possible to realize a desired layout while reducing the length of the wiring 204. In addition, the width of the first part 211 in the direction in which each wiring 204 extends (Z-axis direction in the embodiment described above) may be equal to or less than the width of the spectroscope 1 in the same direction. Even in that case, the second part 212 may be directly connected to the first part 211 with the support substrate 201 lacking the third part 213. In addition, the second part 212 may have a flat plate shape as in the embodiment described above or may have a curved shape.

Figure 14:
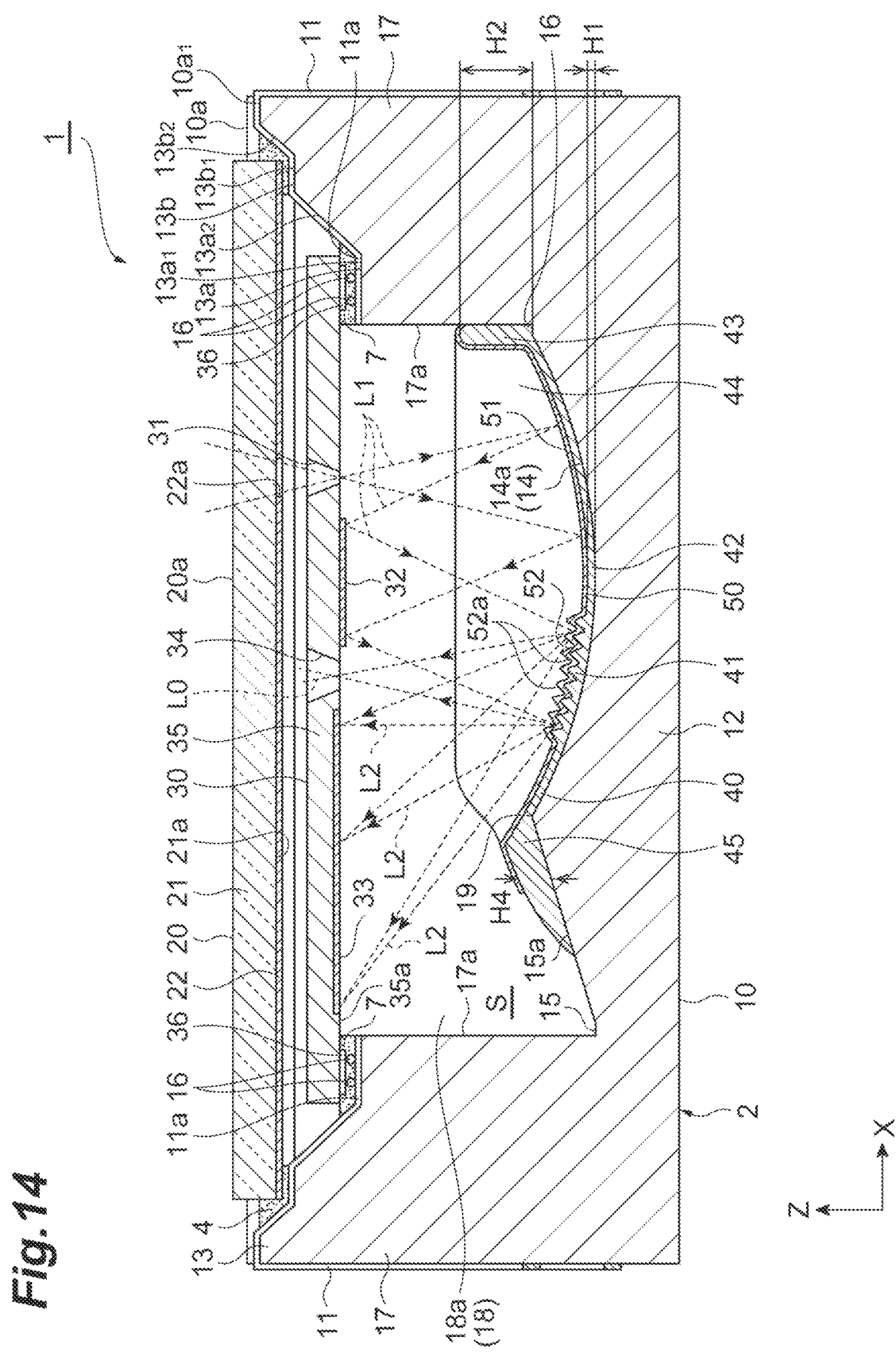
FIG. 14 is a cross-sectional view of a spectroscope of the modification example.

In addition, as illustrated in FIG. 14, a side surface $13a_2$ of the first widened portion 13a may be inclined so as to form an obtuse angle with a bottom surface $13a_1$ of the first widened portion 13a in the first widened portion 13a where the photodetector 30 is disposed. In addition, in the second widened portion 13b where the cover 20 is disposed, a side surface $13b_2$ of the second widened portion 13b may be inclined so as to form an obtuse angle with a bottom surface $13b_1$ of the second widened portion 13b. In this manner, the wiring 11 can be routed with ease and accuracy. In addition, the stress that is generated in the wiring 11 can be reduced.

In addition, the space between the side surface $13a_2$ of the first widened portion 13a and the photodetector 30 may be filled with the reinforcing member 7 that is made of resin. In this manner, the reinforcing member 7 easily enters the gap by the side surface $13a_2$ being inclined, and thus it is possible to more sufficiently reinforce the support of the photodetector 30 and more sufficiently ensure the airtightness at the part. In addition, it is possible to more reliably suppress the misalignment of the photodetector 30 in the X-axis direction (second direction in which the plurality of grating grooves 52a of the spectroscopic portion 52 are arranged) by means of the synergistic effect in relation to the disposition of a bump 61 to be described later. In addition, the space between the side surface $13b_2$ of the second widened portion 13b and the cover 20 may be filled with the sealing member 4 that is made of resin. In this manner, the sealing member 4 easily enters the gap by the side surface $13b_2$ being inclined, and thus it is possible to more sufficiently reinforce the support of the cover 20 and more sufficiently ensure the airtightness at the part. It should be noted that the airtightness may be ensured by the space between the side surface $13a_2$ of the first widened portion 13a and the photodetector 30 being filled with the resinous reinforcing member 7, by the space between the side surface $13b_2$ of the second widened portion 13b and the cover 20 being filled with the resinous sealing member 4, or by both. The airtightness may also be ensured by a configuration other than these airtightness-related configurations (such as accommodating the spectroscope 1 in another package and making the inside of the package airtight).

In addition, as illustrated in FIG. 14, at least a region $10a_1$, where the wiring 11 is disposed, of an end surface 10a of the support body 10 on the side opposite to the bottom wall portion 12 may be positioned closer to the bottom wall portion 12 side than a surface 20a of the cover 20 on the side opposite to the bottom wall portion 12. In this manner, it is possible to prevent the wiring 11 from coming into contact with another member when the spectroscope 1 is mounted. In addition, the length of the wiring 11 can be reduced. It should be noted that the entire end surface 10a of the support body 10 may be positioned closer to the bottom wall portion 12 side than the surface 20a of the cover 20.

In addition, as illustrated in FIG. 14, the cover 20 and the photodetector 30 may be separated from each other. In this manner, the space between the cover 20 and the photodetector 30 traps stray light and the stray light can be removed in a more reliable manner.

In addition, the coefficient of thermal expansion of the support body 10 in the X-axis direction (second direction in which the plurality of grating grooves 52a of the spectroscopic portion 52 are arranged) is equal to or less than the coefficient of thermal expansion of the support body 10 in the Y-axis direction (third direction perpendicular to the second direction and perpendicular to the first direction in which the depressed portion 14 and the photodetector 30 face each other) (it is more preferable that the coefficient of thermal expansion of the support body 10 in the X-axis direction is smaller than the coefficient of thermal expansion of the support body 10 in the Y-axis direction). In other words, the relationship of $\alpha \leq \beta$ is satisfied when the coefficient of thermal expansion of the support body 10 in the X-axis direction is $\alpha$ and the coefficient of thermal expansion of the support body 10 in the Y-axis direction is $\beta$ (it is more preferable that the relationship of a $\alpha < \beta$ is satisfied). In this manner, it is possible to suppress a deviation in the positional relationship between the plurality of grating grooves 52a in the spectroscopic portion 52 and the plurality of photodetection channels 33a in the light detecting portion 33 of the photodetector 30 attributable to the thermal expansion of the support body 10.

In addition, as illustrated in FIG. 14, one terminal 36 of the photodetector 30 and one terminal 11a of the wiring 11 facing each other are connected to each other by, for example, a plurality of the bumps 61 made of Au, solder, or the like and the plurality of bumps 61 may are arranged along the X-axis direction (second direction in which the plurality of grating grooves 52a of the spectroscopic portion 52 are arranged). Further, a plurality of sets of the terminal 36, the terminal 11a, and the plurality of bumps 61 may be provided in the Y-axis direction. In this manner, it is possible to suppress a deviation in the positional relationship between the plurality of grating grooves 52a in the spectroscopic portion 52 and the plurality of photodetection channels 33a in the light detecting portion 33 of the photodetector 30 attributable to, for example, the thermal expansion of the support body 10. In addition, a sufficient space can be used, as compared with a case where the bumps 61 are disposed in one row, by the bumps 61 being disposed in a two-dimensional manner, and thus the area of each terminal 36 can be sufficiently ensured.

In addition, the first widened portion 13a may be a stepped portion where the space S (space where the optical path of the light L1 from the light passage portion 31 to the spectroscopic portion 52, the optical path of the light L2 from the spectroscopic portion 52 to the light detecting portion 33, and the optical path of the 0th-order light L0 from the spectroscopic portion 52 to the 0th-order light capturing portion 34 are formed) is widened in at least one direction (such as the X-axis direction) on the side opposite to the bottom wall portion 12 and may be configured in one stage or in a plurality of stages. Likewise, the second widened portion 13b may be a stepped portion where the first widened portion 13a is widened in at least one direction (such as the X-axis direction) on the side opposite to the bottom wall portion 12 and may be configured in one stage or in a plurality of stages. When each terminal 36 is electrically connected to the terminal 11a of the corresponding wiring 11 by wire bonding with the light detecting portion 33 configured as a backside-incident photodiode and the plurality of terminals 36 provided on the surface of the substrate 35 on the side opposite to the surface 35a, the terminal 11a of each wiring 11 may be disposed in a stage different from the stage where the photodetector 30 is disposed (stage outside and above the stage where the photodetector 30 is disposed) in the multistage first widened portion 13a.

In addition, the support body 10 is not limited to a resinous support body and may be formed of ceramic such as AlN and $Al_2O_3$ or glass for molding. In addition, the shape of the support body 10 is not limited to a rectangular parallelepiped shape and may be, for example, a shape in which the outside surface is provided with a curved surface. In addition, the shape of the side wall portion 13 is not limited to a rectangular ring shape and may be a circular ring shape insofar as the shape is an annular shape surrounding the depressed portion 14 when viewed from the Z-axis direction.

In addition, the photodetector 30 may lack the light passage portion 31, the second reflection portion 32, and the 0th-order light capturing portion 34 insofar as the photodetector 30 has the light detecting portion 33. In addition, the photodetector 30 may be attached to the side wall portion 13 via a member separate from the side wall portion 13. In addition, the spectroscopic portion 52 may be configured as a spectroscopic element and attached to the support body 10.

In addition, the plurality of terminals 11b may be provided on a region other than the outside surface 18b of the one second side wall 18 insofar as the region is the surface of the support body 10. It should be noted that "terminal" is a general term for a part to be connected to another member, may not be a wiring end portion, and may not be wider than the wiring. In other words, the position and shape of the terminal 11b are not limited to those illustrated in FIG. 2. In addition, although the plurality of terminals 11b are disposed so as to surround the space S when viewed from the Y-axis direction and a part of each terminal 11b overlaps the bottom wall portion 12, the pair of first side walls 17, and the photodetector 30 when viewed from the Y-axis direction in the embodiment described above, the position of the terminal 11b is not limited thereto. For example, with regard to at least a part of the plurality of terminals 11b, the entire part of the terminal 11b may overlap the bottom wall portion 12, the pair of first side walls 17, and the photodetector 30 when viewed from the Y-axis direction or the entire part of the terminal 11b may overlap the space S when viewed from the Y-axis direction. In addition, the terminal 11b and the terminal 202 facing each other may be joined to each other via a joining member (such as a conductive adhesive allowing room-temperature joining) other than the joining member 205 (such as solder paste, a solder ball, and a solder ball with a core) capable of joining the terminal 11b and the terminal 202 by heat treatment.

In addition, the spectroscope 1 may lack the first reflection portion 51 and the second reflection portion 32, the light L1 that has passed through the light passage portion 31 may be dispersed and reflected by the spectroscopic portion 52, and the light L2 dispersed and reflected by the spectroscopic portion 52 may be incident on the light detecting portion 33 and detected by the light detecting portion 33. In addition, in the spectroscope 1, the space S may not be airtightly sealed by, for example, a gap being provided in part between the cover 20 and the side wall portion 13.

Figure 15:
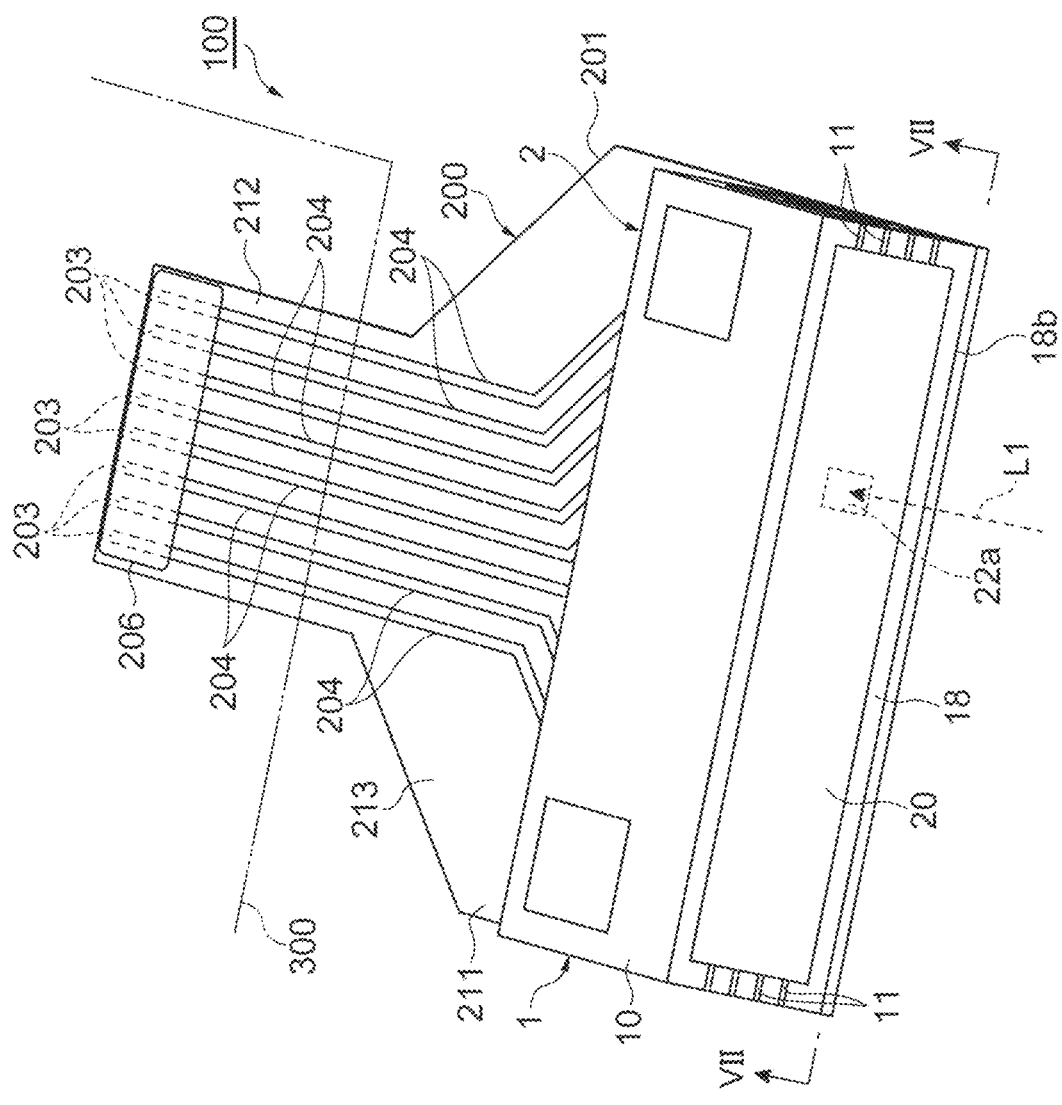
FIG. 15 is a perspective view of the spectroscopic module of the modification example.

In addition, as illustrated in FIG. 15, the spectroscopic module 100 may further include a rigid wiring substrate 300 to which the plurality of terminals 203 of the wiring unit 200 are connected. In that case, it is possible to realize an electrical connection between the photodetector 30 and the rigid wiring substrate 300 while reliably suppressing a decline in detection accuracy in a configuration in which the spectroscopic portion 52 and the photodetector 30 face each other via the space S.

In addition, various materials and shapes can be applied to each configuration of the spectroscopic module 100 without being limited to the above-described material and shape examples. In addition, each configuration in the embodiment or one of the modification examples described above can be applied in any manner to each configuration in another embodiment or modification example.

REFERENCE SIGNS LIST

1: spectroscope, 10: support body, 11b: terminal (first terminal), 12: bottom wall portion, 13: side wall portion, 18b: outside surface (surface), 30: photodetector, 33a: photodetection channel, 52: spectroscopic portion, 52a: grating groove, 100: spectroscopic module, 200: wiring unit, 201: support substrate, 202: terminal (second terminal), 203: terminal (third terminal), 204: wiring, 205: joining member, 300: rigid wiring substrate, S: space.

The invention claimed is:

1. A method for manufacturing spectroscopic module, the method comprising:
   a first step of preparing a spectroscope including a support body having a bottom wall portion and a side wall portion surrounding a space on one side of the bottom wall portion, a spectroscopic portion provided on the one side of the bottom wall portion and having a plurality of grating grooves, a photodetector attached to the side wall portion so as to face the spectroscopic portion via the space and having a plurality of photodetection channels, and a plurality of first terminals provided on a surface of the support body so as to be disposed along the surface of the support body and electrically connected to the photodetector;
   a second step of preparing a wiring unit having a plurality of second terminals and a plurality of third terminals respectively and electrically connected to the plurality of second terminals;
   a third step of causing the plurality of first terminals and the plurality of second terminals to face each other and joining a first terminal and a second terminal to each other after the first step and the second step, the first terminal and the second terminal facing each other in the plurality of first terminals and the plurality of second terminals; and
   a fourth step of acquiring a relationship between a position of each of the plurality of photodetection channels and a peak wavelength of light incident on each of the plurality of photodetection channels after the third step,
   wherein a first terminal and a second terminal facing each other in the plurality of first terminals and the plurality of second terminals are joined to each other via a joining member, and
   wherein the joining member holds a gap formed between the support body and the wiring unit.

2. The method for manufacturing spectroscopic module according to claim 1, wherein the plurality of first terminals are provided on a flat region having a largest area among a plurality of flat regions, the plurality of flat regions constituting the surface of the support body.

3. The method for manufacturing spectroscopic module according to claim 1, wherein the plurality of first terminals are provided on a surface of the side wall portion on the side opposite to the space as the surface of the support body.

4. The method for manufacturing spectroscopic module according to claim 3, wherein the spectroscopic portion and the photodetector face each other in a first direction, the plurality of grating grooves are arranged in a second direction perpendicular to the first direction, and the plurality of first terminals are provided on a region of the surface of the side wall portion, the region extending in the second direction as a longitudinal direction.

5. The method for manufacturing spectroscopic module according to claim 1, wherein the joining member is a solder layer.

6. The method for manufacturing spectroscopic module according to claim 1, wherein each of the plurality of first terminals is a circular electrode pad.

7. The method for manufacturing spectroscopic module according to claim 1, wherein each of the plurality of second terminals is a circular electrode pad.

8. The method for manufacturing spectroscopic module according to claim 1, wherein the plurality of third terminals are configured as a connector.

9. The method for manufacturing spectroscopic module according to claim 1, wherein the wiring unit is configured by a flexible wiring substrate.

10. The method for manufacturing spectroscopic module according to claim 1, wherein
- the wiring unit further has a plurality of wirings respectively connecting the plurality of second terminals and the plurality of third terminals, and a support substrate, and
- a bending strength of the support substrate is smaller than a bending strength of the support body.

11. The method for manufacturing spectroscopic module according to claim 1, further comprising a rigid wiring substrate to which the plurality of third terminals are connected.

* * * * *